(12) United States Patent
Mao et al.

(10) Patent No.: US 12,482,773 B2
(45) Date of Patent: Nov. 25, 2025

(54) INTEGRATED CIRCUIT STRUCTURE, AND METHOD FOR FORMING THEREOF

(71) Applicant: Taiwan Semiconductor Manufacturing Company, Ltd., Hsinchu (TW)

(72) Inventors: Yi-Chao Mao, Taoyuan (TW); Chin-Chuan Chang, Hsinchu County (TW); Szu-Wei Lu, Hsinchu (TW); Kun-Tong Tsai, Hsinchu (TW); Hung-Chih Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/641,442

(22) Filed: Apr. 22, 2024

(65) Prior Publication Data
US 2024/0274560 A1 Aug. 15, 2024

Related U.S. Application Data

(63) Continuation of application No. 18/172,326, filed on Feb. 22, 2023, now Pat. No. 11,996,375, which is a
(Continued)

(51) Int. Cl.
*H01L 23/31* (2006.01)
*H01L 21/48* (2006.01)
(Continued)

(52) U.S. Cl.
CPC .......... *H01L 24/06* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 23/3128* (2013.01); *H01L 23/5383* (2013.01); *H01L 23/5386* (2013.01); *H01L 23/5389* (2013.01); *H01L 24/03* (2013.01); *H01L 24/19* (2013.01);
(Continued)

(58) Field of Classification Search
CPC ............ H01L 21/4853; H01L 21/4857; H01L 21/565; H01L 21/568; H01L 21/6835; H01L 23/3128; H01L 23/5383; H01L 23/5386; H01L 23/5389; H01L 24/03; H01L 24/19; H01L 24/06; H01L 24/20; H01L 2221/68372; H01L 2224/06517; H01L 2224/214
See application file for complete search history.

(56) References Cited

U.S. PATENT DOCUMENTS 9,000,584 B2 4/2015 Lin et al.
9,048,222 B2 6/2015 Hung et al.
(Continued)

*Primary Examiner* — Marlon T Fletcher
*Assistant Examiner* — Christina A Sylvia
(74) *Attorney, Agent, or Firm* — JCIPRNET

(57) ABSTRACT

An integrated circuit structure is provided. The integrated circuit structure includes a die that contains a substrate, an interconnection structure, active connectors and dummy connectors. The interconnection structure is disposed over the substrate. The active connectors and the dummy connectors are disposed over the interconnection structure. The active connectors are electrically connected to the interconnection structure, and the dummy connectors are electrically insulated from the interconnection structure.

20 Claims, 34 Drawing Sheets

Related U.S. Application Data continuation of application No. 17/206,125, filed on Mar. 19, 2021, now Pat. No. 11,616,034.

(51) Int. Cl.
  *H01L 21/56* (2006.01)
  *H01L 21/683* (2006.01)
  *H01L 23/00* (2006.01)
  *H01L 23/538* (2006.01)

(52) U.S. Cl.
  CPC .... *H01L 24/20* (2013.01); *H01L 2221/68372* (2013.01); *H01L 2224/06517* (2013.01); *H01L 2224/214* (2013.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2012/0298410 A1* | 11/2012 | Lu ................ H01L 23/49827 29/593 |
| 2018/0076184 A1* | 3/2018 | Chen ................ H01L 24/73 |

* cited by examiner

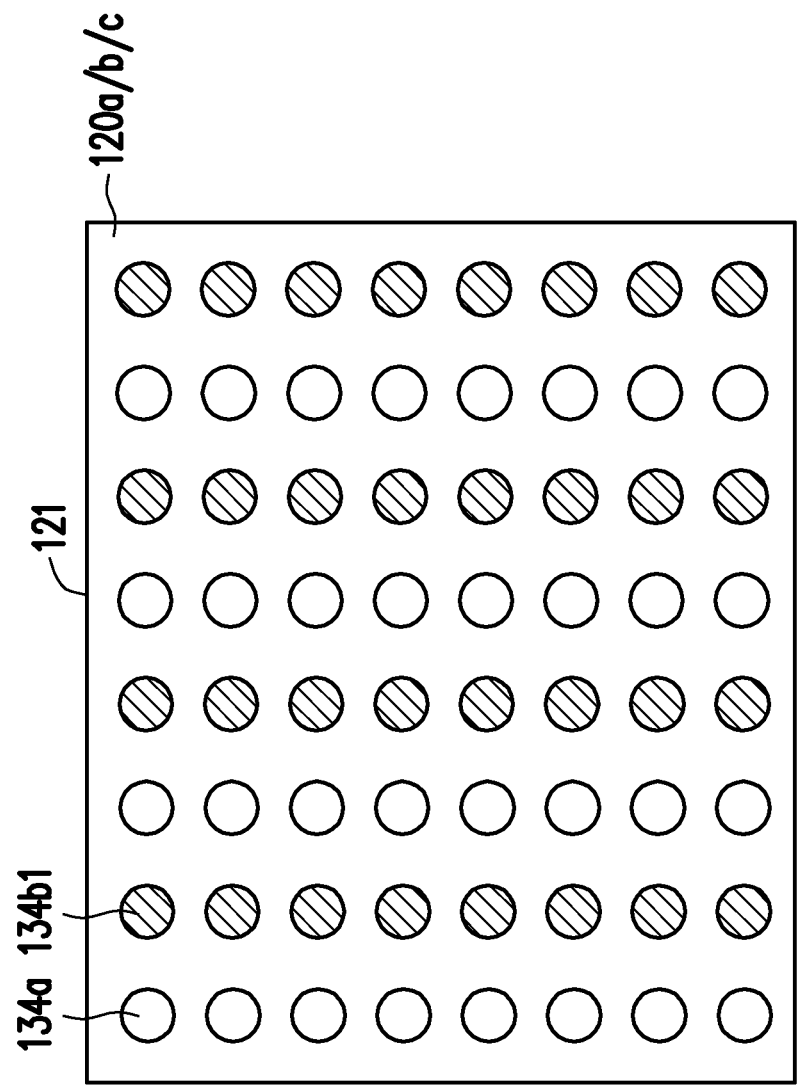

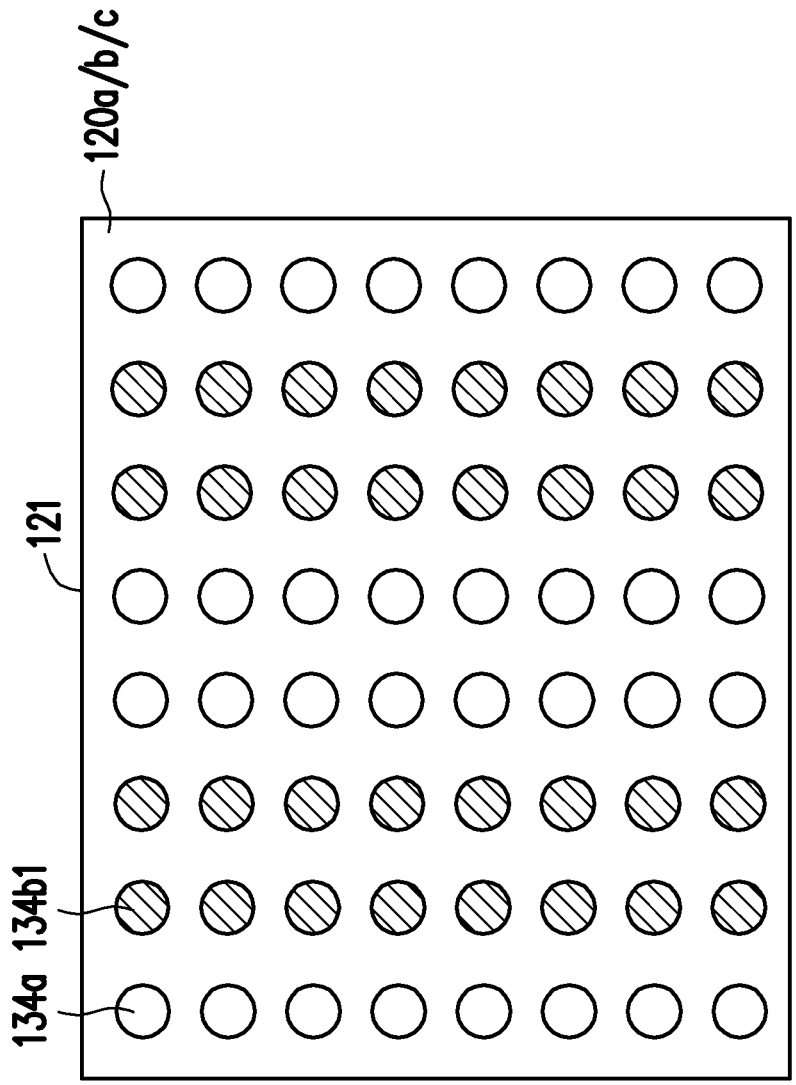

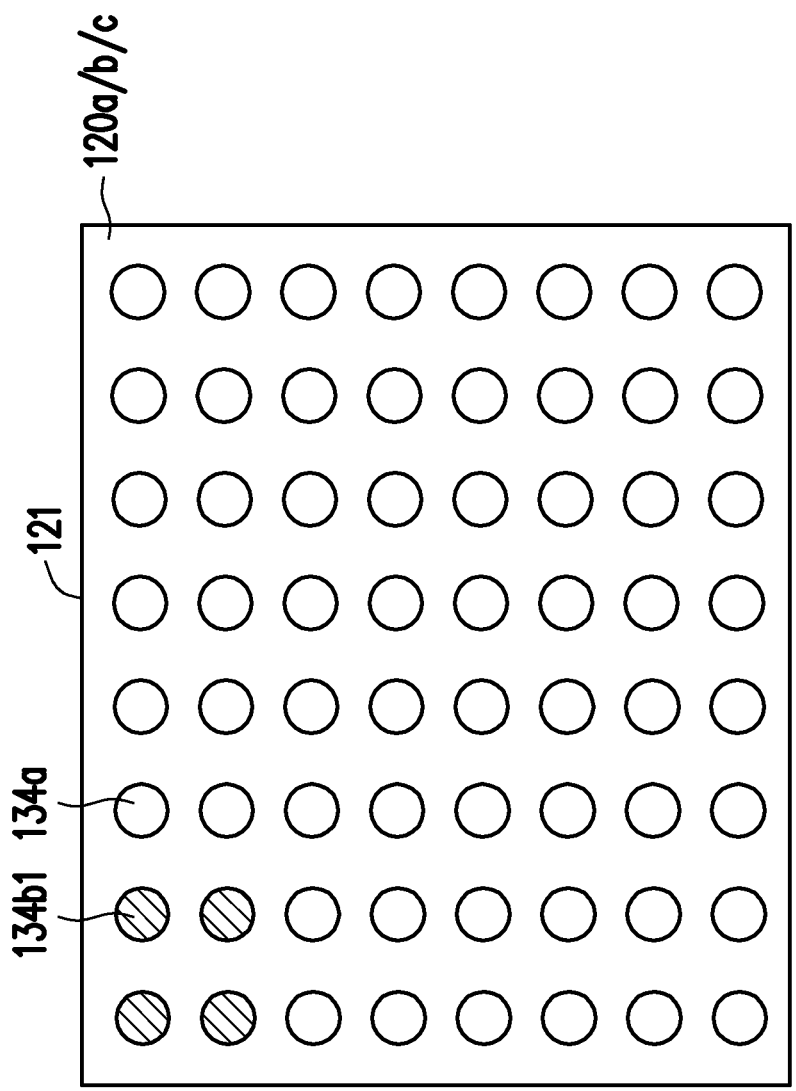

INTEGRATED CIRCUIT STRUCTURE, AND METHOD FOR FORMING THEREOF

CROSS-REFERENCE TO RELATED APPLICATION

This is a continuation application of and claims the priority benefit of a prior application Ser. No. 18/172,326, filed on Feb. 22, 2023, now allowed. The prior application Ser. No. 18/172,326 is a continuation application of and claims the priority benefit of a prior application Ser. No. 17/206,125, filed on Mar. 19, 2021. The entirety of the above-mentioned patent application is hereby incorporated by reference herein and made a part of this specification.

BACKGROUND

The 3D memory stack is a new semiconductor packaging technology having many advantages. Compared to the Chip-on-Wafer-on-Substrate (CoWoS) technology, the 3D memory stack has higher performance with lower cost. In the 3D memory stack, a bridge die is used to connect with other dies. It is important to prevent the bridge die from cracking during the manufacturing process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 12A to FIG. 12F are schematic top views illustrating the arrangements of the conductive connectors and the dummy conductors according to some exemplary embodiments of the present disclosure.

DETAILED DESCRIPTION

Figure 1:
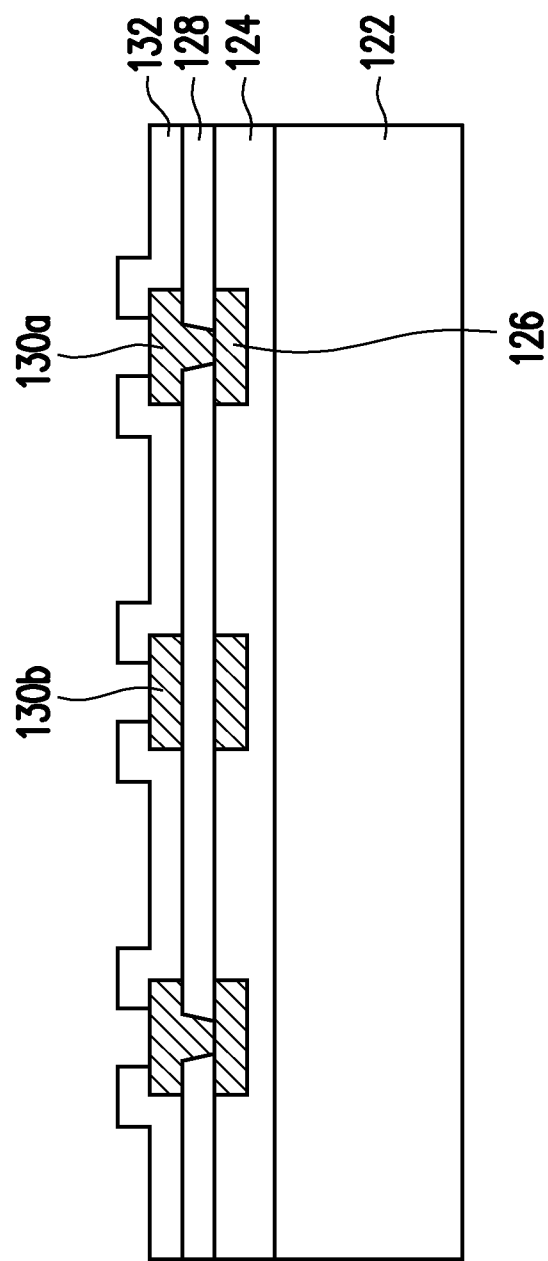
FIG. 1 to FIG. 9 are schematic cross-sectional views of various stages in a manufacturing method of an integrated circuit structure according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 9 are schematic cross-sectional views of various stages in a manufacturing method of an integrated circuit structure according to some exemplary embodiments of the present disclosure. In exemplary embodiments, the manufacturing method is part of an integrated circuit forming process. It is noted that the process operations described herein cover a portion of the manufacturing processes used to fabricate an integrated circuit structure. The embodiments are intended to provide further explanations but are not used to limit the scope of the present disclosure. The integrated circuit structure may also be referred to as an integrated fan-out (InFO) package.

Referring to FIG. 1, as an example to form the integrated circuit (IC) structure, at least one device and an overlying interconnection structure 124 are formed on a semiconductor substrate 122 (or referred to as a wafer), such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 122 and may be interconnected by the interconnection structure 124 formed by, for example, metallization patterns in one or more dielectric layers on the semiconductor substrate 122 to form an integrated circuit. The top metal patterns 126 are formed at the topmost layer of the interconnection structure 124. The material of the top metal patterns 126 may include copper, aluminum, gold, nickel, palladium, the like, or a combination thereof.

A dielectric layer 128 is formed on the interconnection structure. Pads 130a and 130b are formed on the dielectric layer 128 and the interconnection structure 124, such as aluminum pads. The pads 130a may also be referred to as the active pads, and the pads 130b may also be referred to as the dummy pads. The active pads 130a are electrically connected to a front-side or a back-side redistribution layer or an electrical component of the same package structure or another package structure. The dummy pads 130b are at a floating potential and electrically insulated from a front-side or back-side redistribution layer structure or an electrical component of the same package structure or another package structure. The pads 130a and 130b are on the active side of the semiconductor substrate 122. The active side is the front side of the semiconductor substrate 122 on which the device is formed. The pads 130a are electrically connected to the top metal patterns 126 of the interconnection structure 124. The pads 130b are electrically isolated from the top metal patterns 126 of the interconnection structure.

A passivation film 132 is formed on the dielectric layer 128 and on portions of the pads 130a and 130b. Openings are formed on the passivation film 132 and extend through the passivation film 132 to the pads 130a and 130b.

Figure 2:
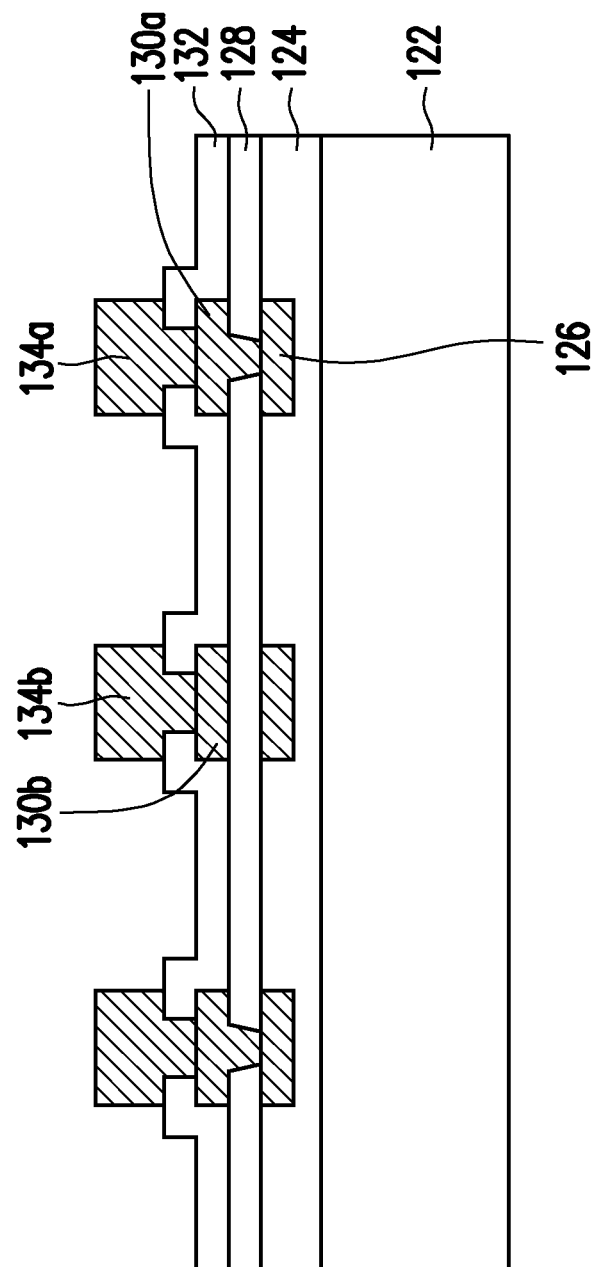

Referring to FIG. 2, active connectors 134a and dummy connectors 134b are formed on the pads 130a and pads 130b respectively. The active connectors 134a are electrically connected to a front-side or a back-side redistribution layer or an electrical component of the same package structure or another package structure. The dummy connectors 134b are at a floating potential and electrically insulated from a front-side or back-side redistribution layer structure or an electrical component of the same package structure or another package structure. The forming process of the active connectors 134a and the dummy connectors 134b is the following. A seed layer (not shown) is formed over the pads 130a and 130b and the passivation film 132 and in the openings extending through the passivation film 132. In some embodiments, the seed layer is a metal layer, which may be a single layer or a composite layer comprising a plurality of sub-layers formed of different materials. In some embodiments, the seed layer includes a titanium layer and a copper layer over the titanium layer. In some embodiments, the seed layer which includes a titanium layer and a copper layer. The seed layer may be formed by using, for example, physical vapor deposition (PVD) or the like.

A photoresist is then formed and patterned on the seed layer. The photoresist may be formed by spin coating or the like and may be exposed to light for patterning. The patterning forms via openings through the photoresist to expose the seed layer.

A conductive material is then formed in the via openings of the photoresist and on the exposed portions of the seed layer where the active connectors 134a and the dummy connectors 134b are subsequently formed. In some embodiments, the conductive material may include a conductive material such as copper, aluminum, gold, nickel, palladium, the like, or a combination thereof, and may be formed by sputtering, printing, electro plating, electroless plating, CVD, or the like.

After forming the active connectors 134a and the dummy connectors 134b, the photoresist is removed by an ashing or stripping process, such as using an oxygen plasma or the like.

Once the photoresist is removed, the exposed portions of the seed layer are etched by using an etching process. After the etching process, the exposed portions of the seed layer are removed. The remaining portions of the seed layer are formed below the active connectors 134a and the dummy connectors 134b, respectively.

Figure 3:
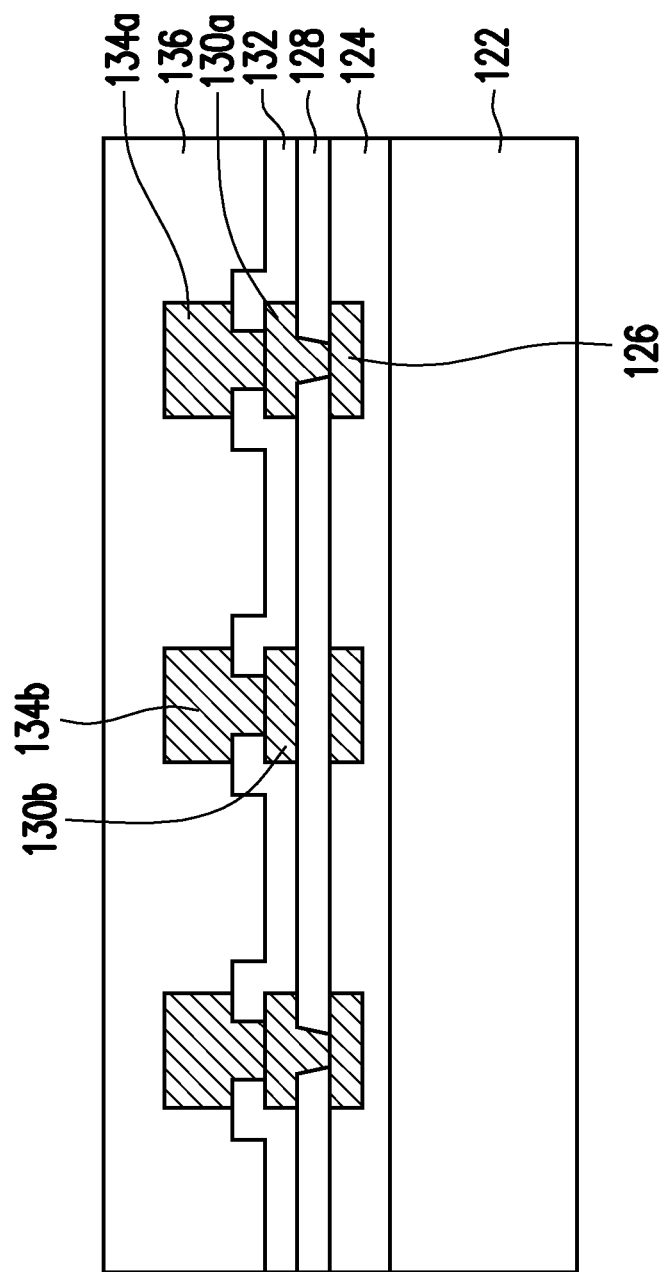

Referring to FIG. 3, a protection layer 136 is formed on the active side of the semiconductor substrate 122, such as on the passivation film 132 and the active connectors 134a and the dummy connectors 134b. The protection layer 136 laterally encapsulates the active connectors 134a and the dummy connectors 134b. The protection layer 136 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

Figure 4:
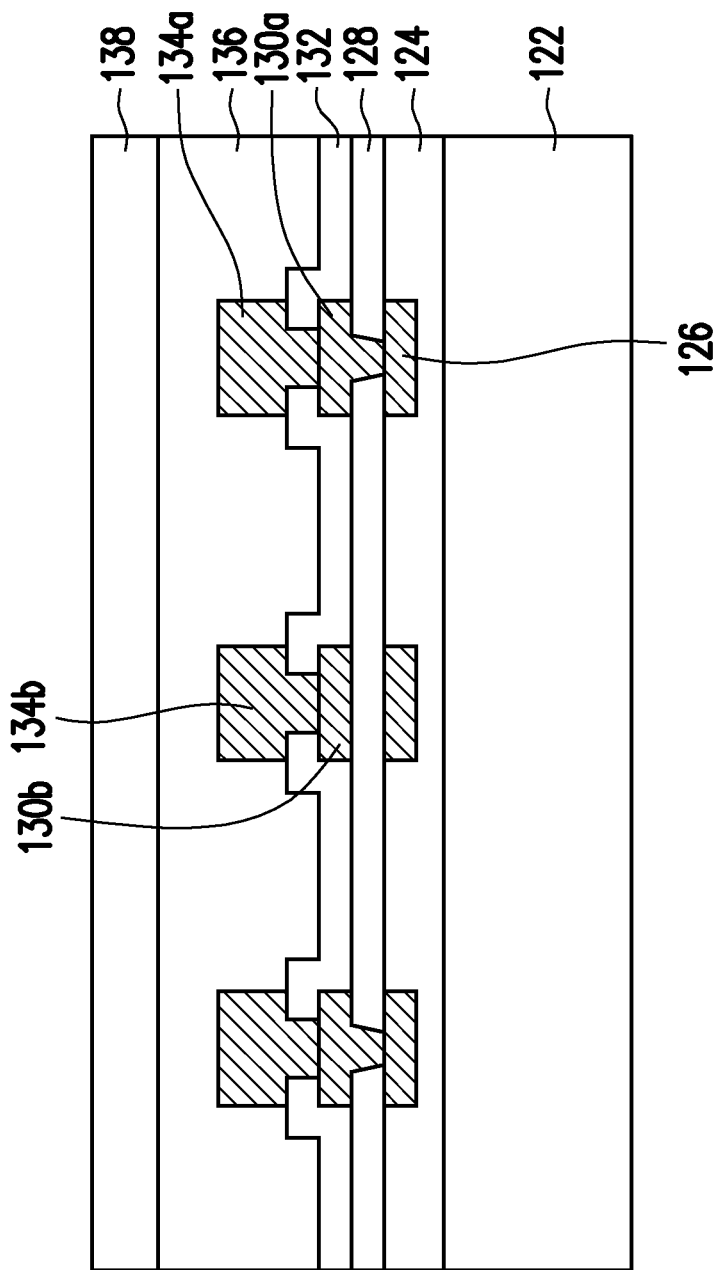

Referring to FIG. 4, a tape 138 is disposed on the protection layer 136 to cover the protection layer 136 on the active connectors 134a, dummy connectors 134b, and passivation film 132. The tape 138 may include a polyvinyl-chloride (PVC)-based polymer sheet, and an acrylic resin-based ultraviolet (UV) curable adhesive layer. The tape 138 is removable by irradiated with UV light.

Figure 5:
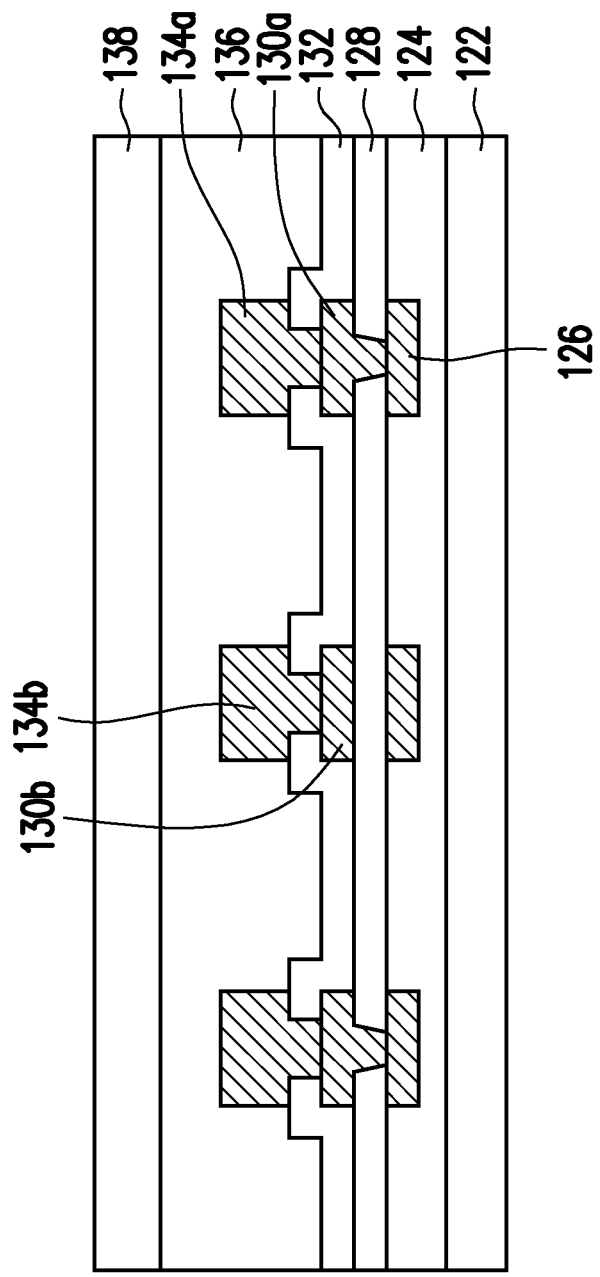

Referring to FIG. 5, a grinding process is performed on the semiconductor substrate 122 to reduce the thickness of the semiconductor substrate 122. In some embodiments, the semiconductor substrate 122 is grinded by a mechanical grinding process and/or a chemical mechanical polishing process (CMP). During the grinding process of the semiconductor substrate 122, the active connectors 134a and dummy connectors 134b are protected by the protection layer 136 and the tape 138 from damage. After grinding the semiconductor substrate 122, thickness of the semiconductor substrate 122 may be smaller than the original thickness of the semiconductor substrate 122.

Figure 6:
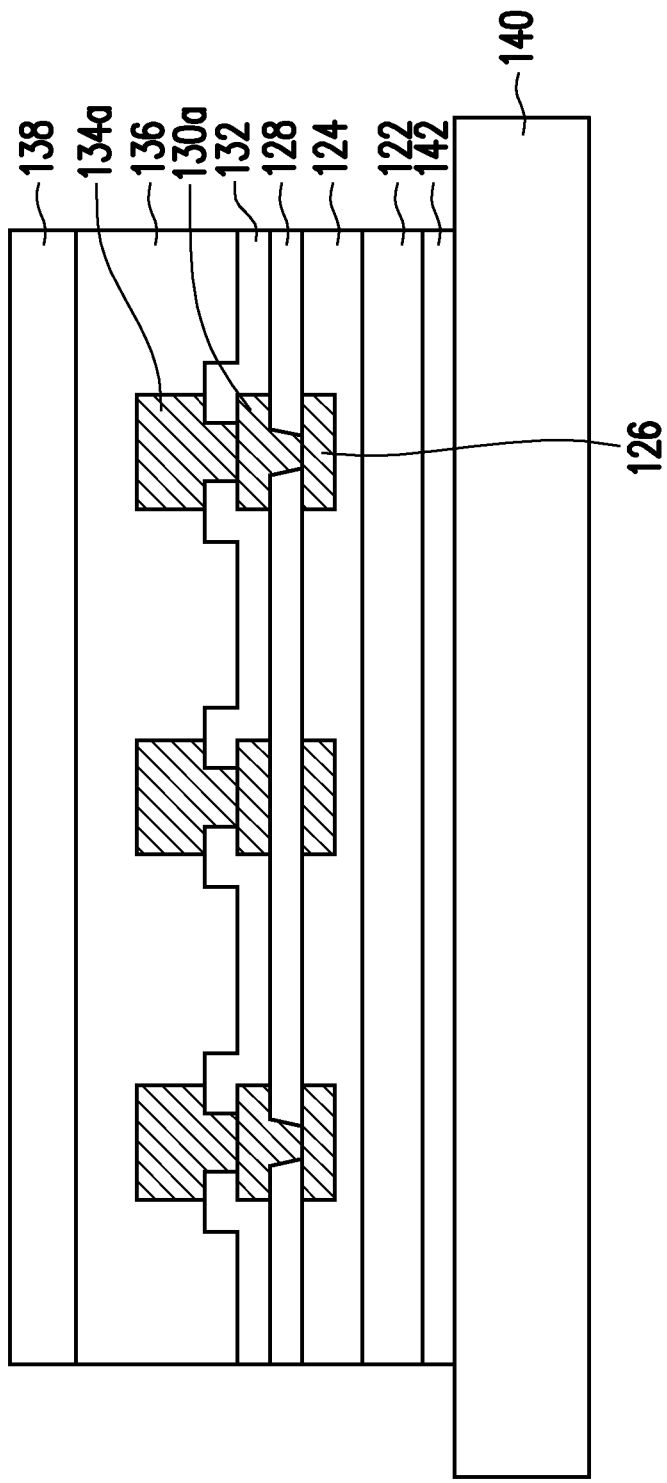

Referring to FIG. 6, the thinned semiconductor substrate 122 is adhered to a carrier substrate 140 by an adhesive layer 142. The carrier substrate 140 may be a glass carrier substrate, a ceramic carrier substrate, or the like. The adhesive layer 142 may be any suitable glue, epoxy, die attach film (DAF), or the like.

Figure 7:
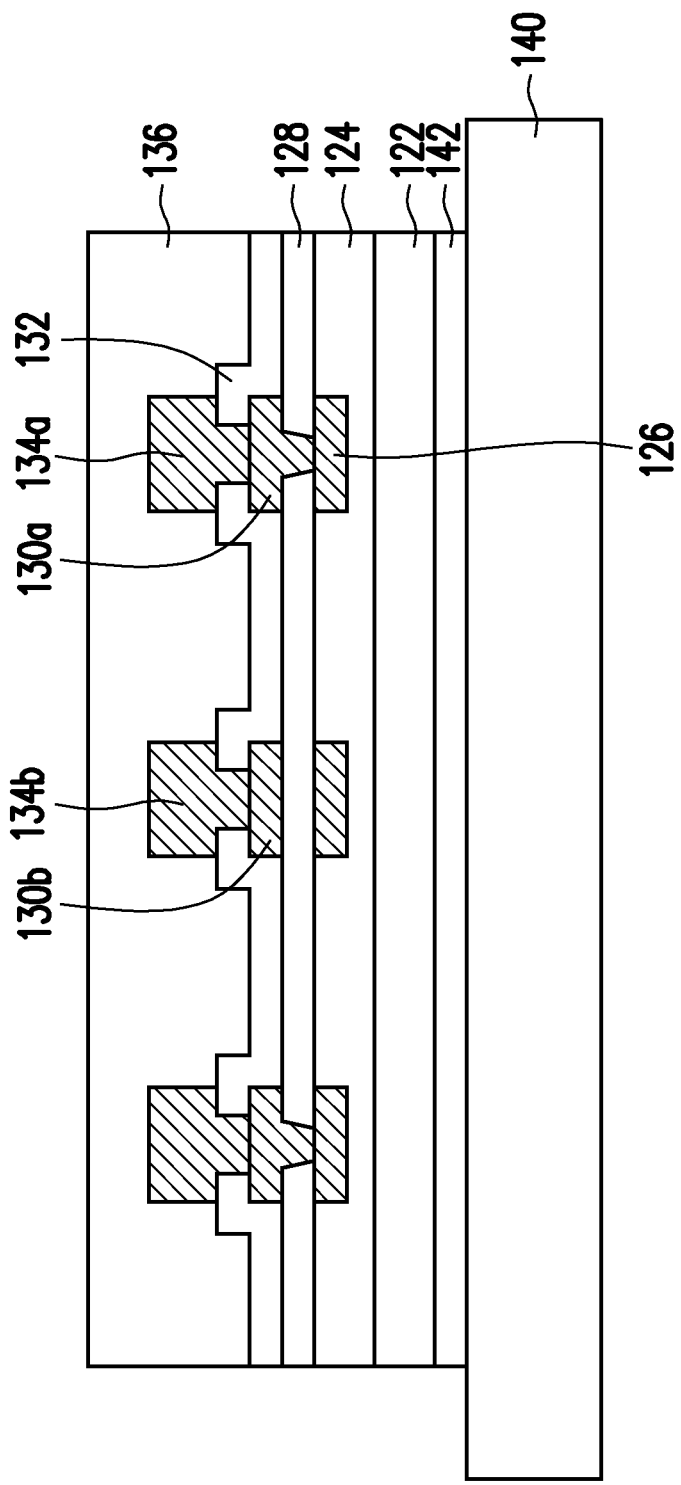

Referring to FIG. 7, the tape 138 is removed from the protection layer 136 to expose the top surface of the protection layer 136. In some embodiments, the tape 138 is removed by irradiated with UV light.

Figure 8:
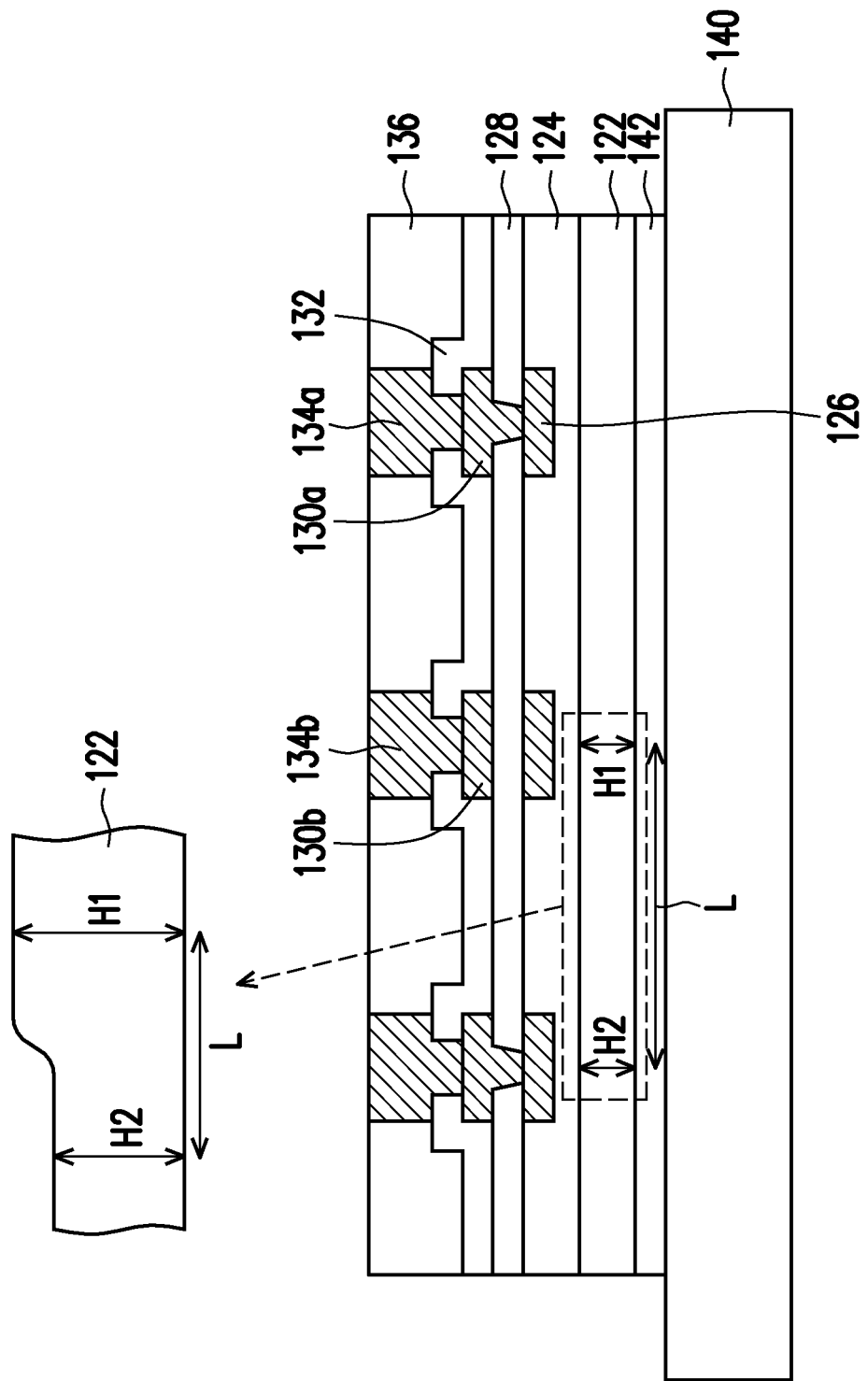

Referring to FIG. 8, a planarization process is performed on the protection layer 136 to remove a portion of the protection layer 136 to expose the top surfaces of the active connectors 134a and dummy connectors 134b. In some embodiments which the top surfaces of the active connectors 134a and dummy connectors 134b and the front-side surfaces of the IC die 120a are not coplanar, portions of the active connectors 134a and dummy connectors 134b or/and portions of the protection layer 136 may also be removed by the planarization process. In some embodiments, top surfaces of the active connectors 134a and dummy connectors 134b, and the protection layer 136 are substantially coplanar after the planarization process. The planarization process may be, for example, a chemical-mechanical polishing process (CMP), a grinding process, or the like.

The thicknesses of the semiconductor substrate 122 at positions corresponding to the active connectors 134a and the dummy connectors 134b are H2 and H1 respectively. In some embodiments, the active connector 134a is adjacent to the dummy connector 134b. In some embodiments, the active connector 134a is not adjacent to the dummy connector 134b. The distance L is a predetermined distance which is from a region of active connectors 134a to a region of dummy connectors 134b.

During the planarization process, or the grinding process, to expose the top surfaces of the active connectors 134a and dummy connectors 134b, the top surfaces of top surfaces of the active connectors 134a and dummy connectors 134b, and the protection layer 136 are pressed and grinded.

In some embodiments, during the planarization process to expose the top surfaces of the active connectors 134a and the dummy connectors 134b, the pressure is applied to the top surfaces of the active connectors 134a, the dummy connectors 134b and the protection layer 136. Since the active connectors 134a and the dummy connectors 134b are made of metal, which is typically harder than the protection layer 136, the corresponding positions of the active connectors 134a at the semiconductor substrate 122 and the corresponding positions of the dummy connectors 134b at the semiconductor substrate 122 may be pressed more evenly. As a result, with the presence of the dummy connectors 134b, the thickness H1 of the semiconductor substrate is still larger than the thickness H2 of the semiconductor substrate 122, but the thickness difference between H1 and H2 is reduced. In other words, the thickness of the semiconductor substrate 122 is more even. In some embodiments, with the presence of the dummy connectors 134b, the thickness of H1 is less than about 100 μm and the thickness of H2 is less than about 100 μm. In some embodiments, the thickness of H1 is about 40-50 μm (e.g., 47.2 to 49.1 μm), and the thickness of H2 is about 45-55 μm (e.g., 50.3 μm). In some embodiments, the average thickness of the semiconductor substrate 122, (H1+H2)/2, is about 45-55 μm (e.g., 49.1 μm). The total thickness variation of the semiconductor substrate 122 is (H1−H2)/2. The smaller the total thickness variation, the semiconductor substrate 122 has a more thickness. In some embodiments, with the presence of dummy connectors 134b, the total thickness variation is about 0.5-10 μm (e.g. 5.1 μm). The ratio between the average thickness of the semiconductor substrate 122 and the total thickness variation of the semiconductor substrate 122, (H1+H2)/(H1−H2), is a measure of the thickness variation of the semiconductor substrate 122. The larger of this ratio means the thickness variation of the semiconductor substrate 122 is small. In some embodiments, with the presence of the dummy connectors 134b, the ratio between the average thickness of the semiconductor substrate 122 and the total thickness variation of the semiconductor substrate 122, which is (H1+H2)/(H1−H2) is between 5-20 (e.g., 9.6 (=49.1/5.1)), which is improved from 4.5 where there is no dummy connectors presented. The average thickness variation, which is a ratio of the difference between H1 and H2 to the predetermined distance L, (H1−H2)/L, is smaller than or equal to 0.05 (e.g., 0.025). With the presence of the dummy connectors 134b, the total thickness variation is significantly reduced, compared to the case without the presence of the dummy connectors 134b. The smaller total thickness variation of the semiconductor substrate 122 may prevent the semiconductor substrate 122 from cracking and protects the device.

Figure 9:
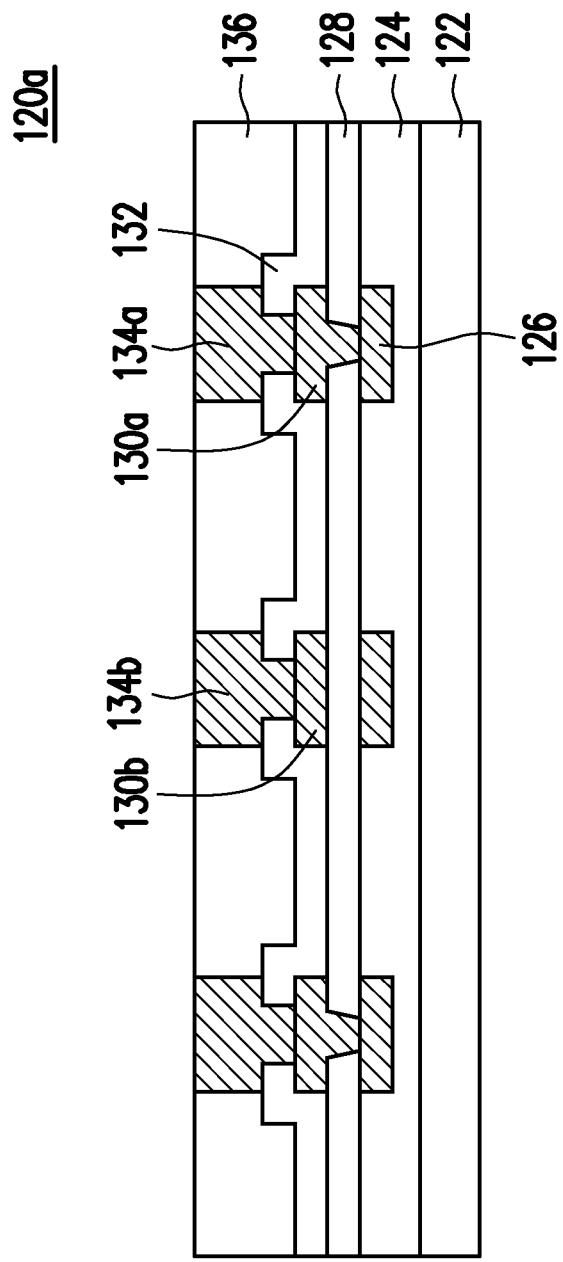

Referring to FIG. 9, a carrier substrate de-bonding is performed to detach (or "de-bond") the carrier substrate 140 from the semiconductor substrate 122 to form an integrated circuit structure 120a or an IC die 120a. In some embodiments, the de-bonding includes projecting a light such as a laser light or an UV light on the adhesive layer 142 so that the adhesive layer 142 decomposes under the heat of the light and the carrier substrate 140 may be removed. The IC die 120a is then being placed on a tape (not shown).

The IC die 120a is formed with dummy connectors 134b in the protection layer 136. With the presence of the dummy connectors 134b, the semiconductor substrate 122 may be prevented from cracking during exposing the top surfaces of the active connectors 134a, and thus enhance the yield of the package.

Figure 10:
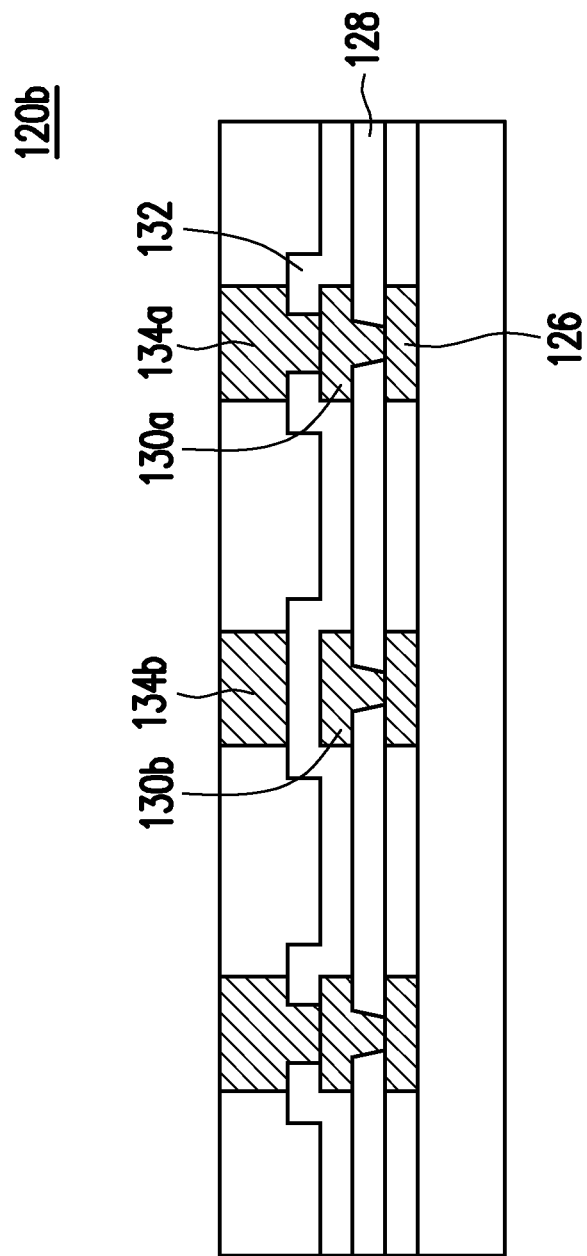
FIG. 10 is a schematic cross-sectional view according to some exemplary embodiments of the present disclosure.
Figure 11:
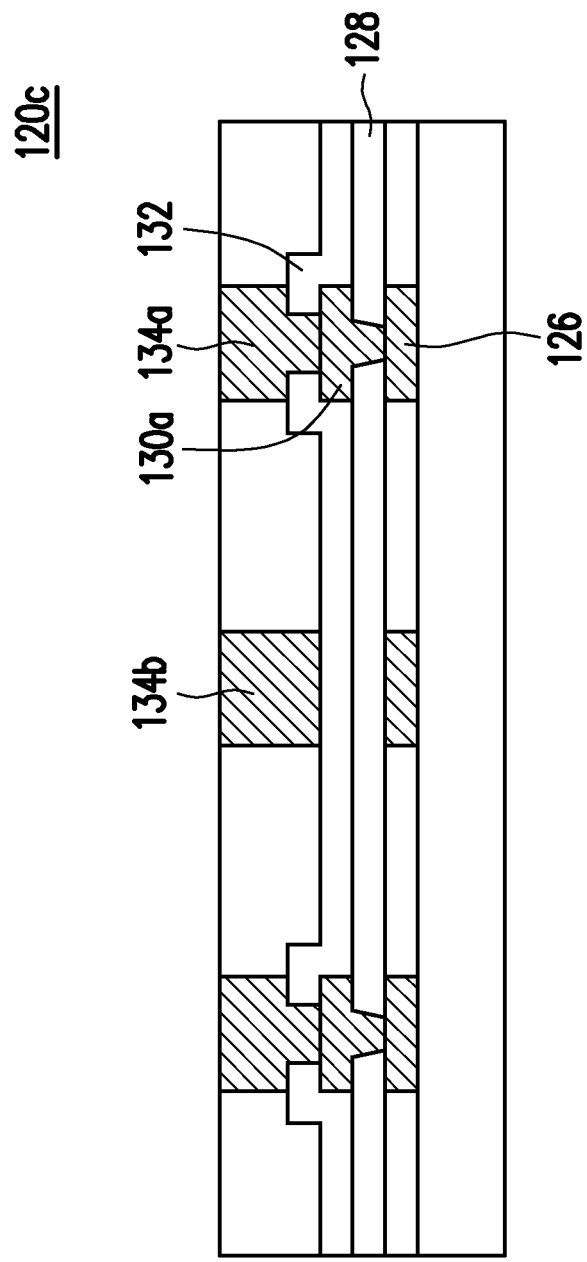
FIG. 11 is a schematic cross-sectional view according to some exemplary embodiments of the present disclosure.

Referring to FIG. 10 and FIG. 11, according to some embodiments, the IC dies 120b and 120c are similar to the IC die 120a illustrated in FIG. 9. The difference is the following. In some embodiments, as shown FIG. 10, the pads 130b are connected to the top metal patterns 126. The passivation film 132 is formed on the pad 130b and covers the pad 130b, instead of exposing a portion of pad 130b, as shown in FIG. 9. The dummy connector 134b is then formed on the passivation film 132 at a position corresponding to the position of the pad 130b. The dummy connector 134b is electrically disconnected or isolated from the pad 130b, due to the passivation film 132 between the pad 130b and the dummy connector 134b.

In some embodiments, as shown FIG. 11, the dummy connector 134b is formed on the passivation film 132 at a position corresponding to the top metal patterns 126. There is no pad formed at the corresponding position of the dummy connector 134b. The dummy connector 134b is electrically disconnected or isolated from the top metal patterns 126, due to the dielectric layer 128 and the passivation film 132 between the pad 130 and the dummy connector 134b.

Referring to FIG. 12A to FIG. 12F, schematic top views illustrating the arrangements of the conductive connectors and the dummy conductors on the IC die 120a/b/c according to some exemplary embodiments are presented.

Referring to FIG. 12A, the active connectors 134a are arranged in columns on the die region 121 of the IC die 120a/b/c. The dummy connectors 134b1 are arranged in columns between the columns of the active connectors 134a and evenly distributed aside of the active connectors 134a to fill the available or sparse region on the die region 121 or on the die region 121 of the IC die 120a/b/c. A dimension of the dummy connectors 134b1 is substantially the same as a dimension of the active connectors 134a. The dimension includes a width, an area, or both, for example. The active connectors 134a and dummy connectors 134b1 together are evenly distributed on the die region 121 of the IC die 120a/b/c.

Referring to FIG. 12B, which is similar to FIG. 12A, the active connectors 134a are arranged in columns on the die region 121 of the IC die 120a/b/c. Two columns of dummy connectors 134b1 are arranged between the active connectors 134a and evenly distributed aside of the active connectors 134a to fill the available or sparse region on the die region of the die. The number of columns of dummy connectors 134b1 arranged between the active connectors 134a are may be one, two or other integers, which is not limited thereto. The active connectors 134a and dummy connectors 134b1 together are evenly distributed on the die region 121 of the IC die 120a/b/c.

Referring to FIG. 12C, the active connectors 134a are configured to cover most of the die region 121 of the IC die 120a/b/c, except the upper-left corner of the IC die 120a/b/c. The dummy connectors 134b1 are arranged at the upper-left corner of IC die 120a/b/c to cover the area not covered by the active connectors 134a. In some embodiments, the dummy connectors 134b1 are arranged at more than one corner of the IC die 120a/b/c. The active connectors 134a and dummy connectors 134b1 together are evenly distributed on the die region 121 of the IC die 120a/b/c.

Figure 12D:
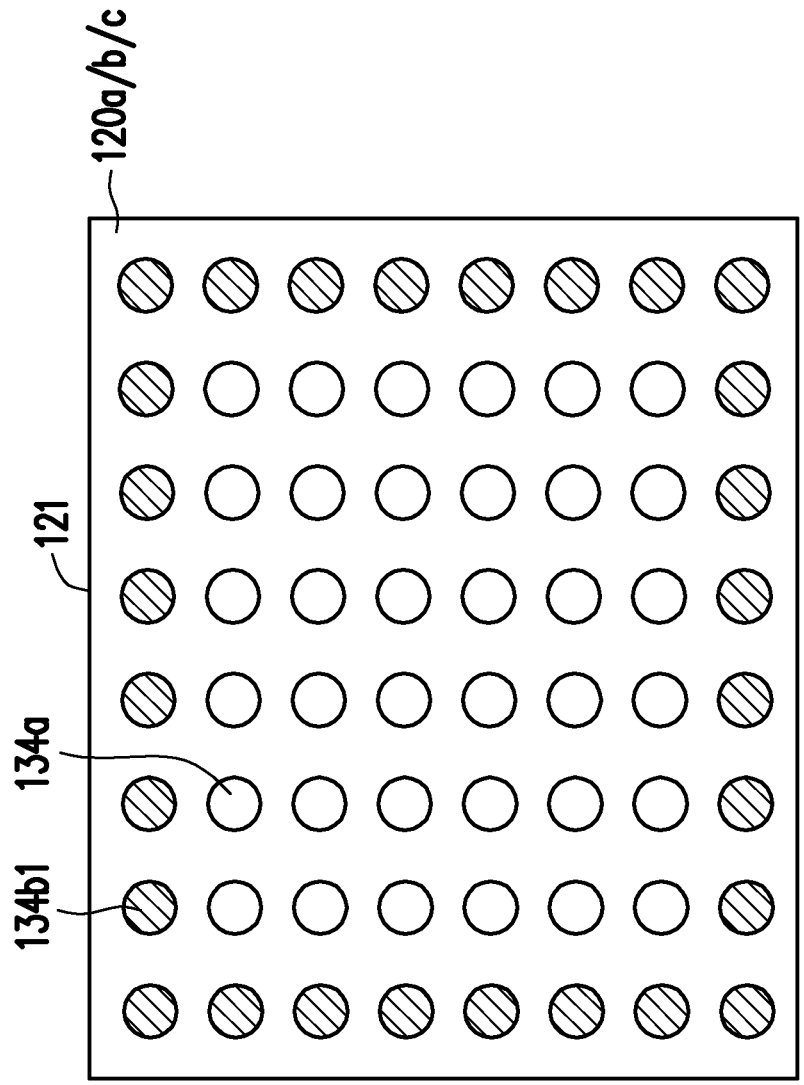

Referring to FIG. 12D, the active connectors 134a are arranged at the center of the die region 121 of the IC die 120a/b/c. The dummy connectors 134b1 are arranged at the edge of the IC die 120a/b/c surrounding the active connectors 134a to cover the area not covered by the active connectors 134a. In some embodiments, the number of layers of dummy connectors 134b1 surrounding the active connectors 134a are not limited. The active connectors 134a and dummy connectors 134b1 together are evenly distributed on the die region 121 of the IC die 120a/b/c.

Figure 12E:
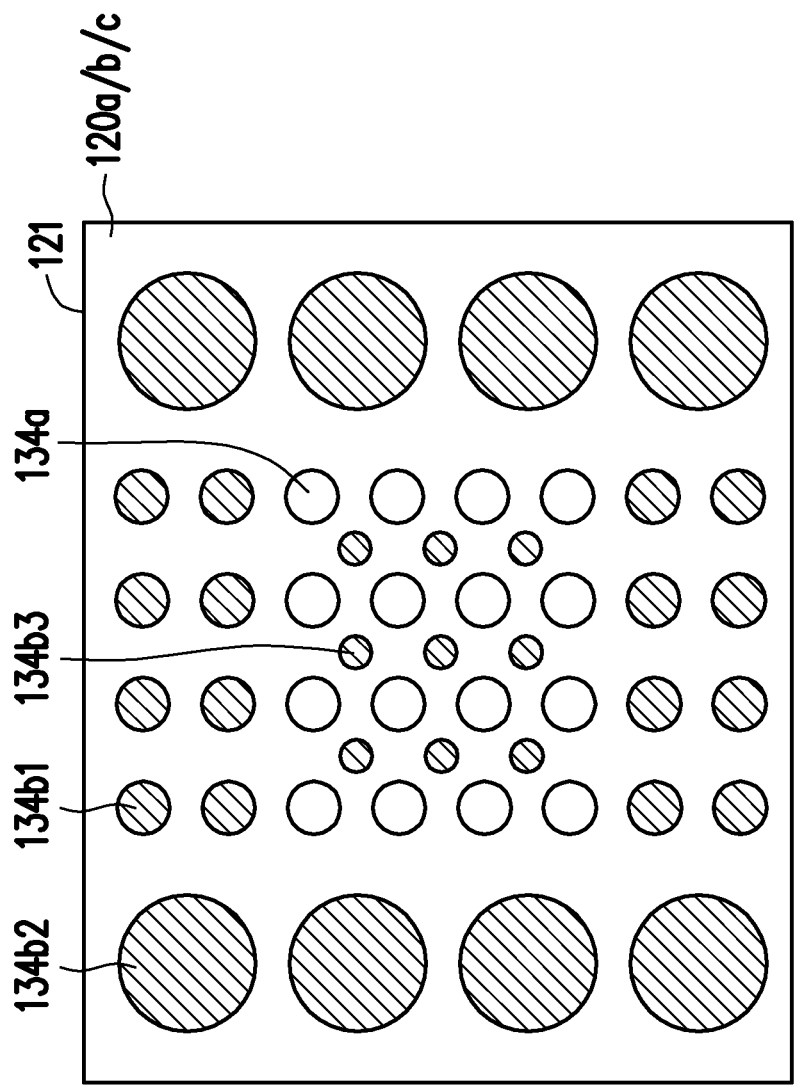

Referring to FIG. 12E, the active connectors are arranged at the center of die region 121 of the IC die 120a/b/c. The dummy connectors 134b1 and 134b2 are arranged to surround the active connectors 134a and dummy connectors 134b3 are arranged among the active connectors 134a. In other words, the dummy connectors 134b1, 134b2 and 134b3 are arranged at regions not covered by the active connectors. Dummy connectors 134b1, 134b2, and 134b3 have different sizes. Specifically, the dimension of the dummy connectors 134b1 is substantially the same as the dimension of the active connectors 134a. The dimensions of the dummy connectors 134b2 and 134b3 are different from the dimension of the active connectors 134a. The dimension of the dummy connectors 134b2 is larger than the dimension of the dummy connectors 134b1, and the dimension of the dummy connectors 134b3 is smaller than the dimension of the dummy connectors 134b1. With dummy connectors having different dimensions, the dummy connectors may cover the die region 121 of the IC die 120a/b/c more effectively. The active connectors 134a and dummy connectors 134b1, 134b2 and 134b3 together substantially covers the die region 121 of the IC die 120a/b/c.

Figure 12F:
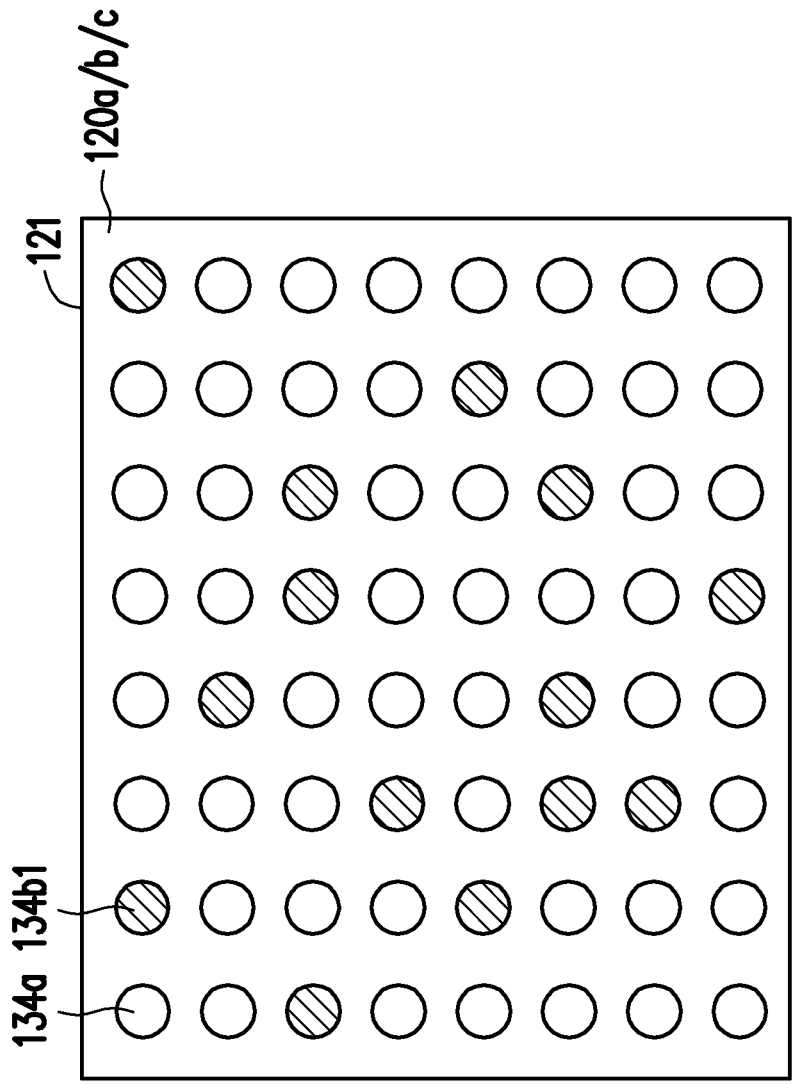

Referring to FIG. 12F, the active connectors are arranged randomly on the die region 121 of the IC die 120a/b/c. The dummy connectors 134b1 are arranged to fill in the space between the arrangement of the active connectors 134a to cover the area not covered by the active connectors 134a. The active connectors 134a and dummy connectors 134b1 together are evenly distributed on the die region 121 of the IC die 120a/b/c.

The said embodiments in which the arrangements of the dummy and active connectors are provided merely for illustration purposes, and are not to be construed as limiting the scope of the present disclosure. In alternative embodiments, other shaped dummy connectors (e.g., walls, rings or the like) are applicable to the present disclosure. The dummy connectors are arranged to cover the available or sparse region on the die region of the die which is not covered by the active connectors. By such disposition, the dummy connectors prevent the semiconductor substrate 122 from cracking during the grinding process to reveal the top surfaces of the active connectors, and therefore improve the yield of the integrated circuit structure.

FIG. 13 to FIG. 29 are schematic cross-sectional views of various stages in a manufacturing method of an integrated circuit structure according to some exemplary embodiments of the present disclosure. In exemplary embodiments, the manufacturing method is part of an integrated circuit forming process. It is noted that the process operations described herein cover a portion of the manufacturing processes used to fabricate an integrated circuit structure. The embodiments are intended to provide further explanations but are not used to limit the scope of the present disclosure. The integrated circuit structure may also be referred to as an integrated fan-out (InFO) package.

Figure 13:
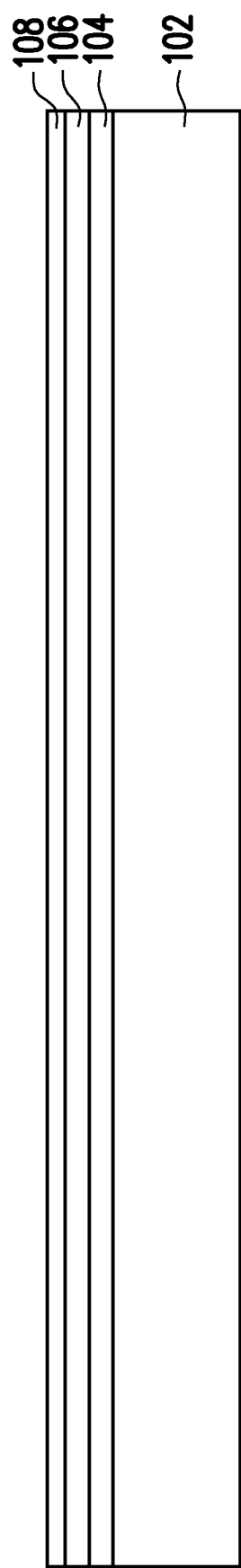
FIG. 13 to FIG. 29 are schematic cross-sectional views of various stages in a manufacturing method of an integrated circuit structure according to some exemplary embodiments of the present disclosure.

Referring to FIG. 13, a carrier substrate (or referred to as a substrate) 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages may be formed on the carrier substrate 102 simultaneously.

A release layer 104 may be formed of a polymer-based material, which may be removed along with the carrier substrate 102 from the overlying structures that will be formed in subsequent operations. In some embodiments, the release layer 104 is an epoxy-based thermal-release material, which loses its adhesive property when heated, such as a light-to-heat-conversion (LTHC) release coating. In other embodiments, the release layer 104 may be an UV glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

A dielectric layer 106 is formed on the release layer 104. The bottom surface of the dielectric layer 106 may be in contact with the top surface of the release layer 104. In some embodiments, the dielectric layer 106 is formed of a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

A seed layer 108 is formed on the dielectric layer 106. In some embodiments, the seed layer 108 is a metal layer, which may be a single layer or a composite layer comprising a plurality of sub-layers formed of different materials. For example, the seed layer 108 includes a titanium layer and a copper layer over the titanium layer. The seed layer 108 may be formed by using, for example, physical vapor deposition (PVD) or the like.

Figure 14:
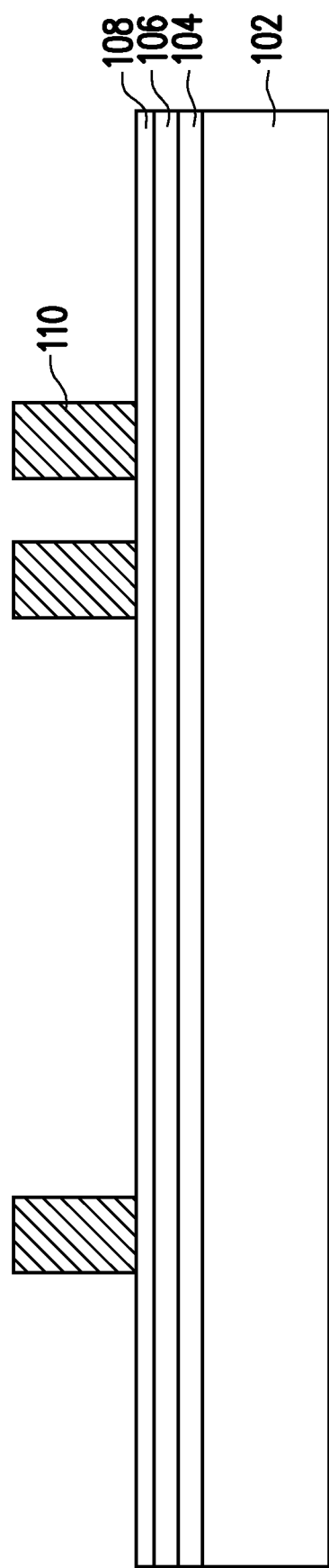

Referring to FIG. 14, a photoresist is formed and patterned on the seed layer 108. The photoresist may be formed by spin coating or the like and may be exposed to light for patterning. The patterning forms openings having substantial vertical profiles through the photoresist to expose the seed layer 108. After the photoresist is patterned, the photoresist may be referred to as a patterned mask layer. A conductive material is formed in the openings of the photoresist and on the exposed portions of the seed layer 108 where the conductive pillars 110 are subsequently formed. The conductive material may be formed by plating, such as electroplating, electroless plating, or the like. The conductive material may include a metal, such as copper, titanium, tungsten, aluminum, or the like. Since the openings of the photoresist have substantial vertical profiles, the conductive pillars 110 formed in the openings also have substantial vertical profiles. The photoresist is then removed to expose a portion of the seed layer 108. The photoresist may be removed by an ashing or stripping process, such as using an oxygen plasma or the like, for example. After the photoresist is removed, conductive pillars 110 are formed on the seed layer 108 and the dielectric layer 106.

Figure 15:
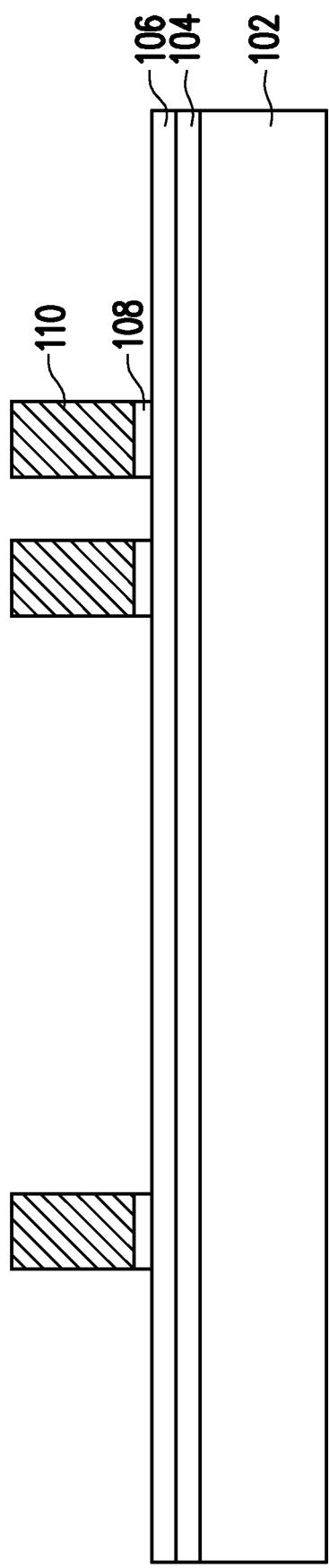

Referring to FIG. 15, once the photoresist is removed, the exposed portions of the seed layer 108 which are not covered by the conductive pillars 110 are etched by an etching process, such as by a wet or dry etching process, so the exposed portions of the seed layer 108 are removed. In some embodiments, the etching process to etch the seed layer 108 is a wet etching process. The etchant used in the wet etching process may include hydrogen peroxide ($H_2O_2$), phosphoric acid ($H_3PO_4$), sulfuric acid ($H_2SO_4$) or a combination thereof. In some embodiments, the etching process is a dry etching process. The gas used in the dry etching process may include argon, a mixture of argon/oxygen, argon/nitrogen, argon/helium or other gas mixture containing argon. In some embodiments, a clean process may be additionally performed after the etching process etching the exposed seed layer 108.

Figure 16:
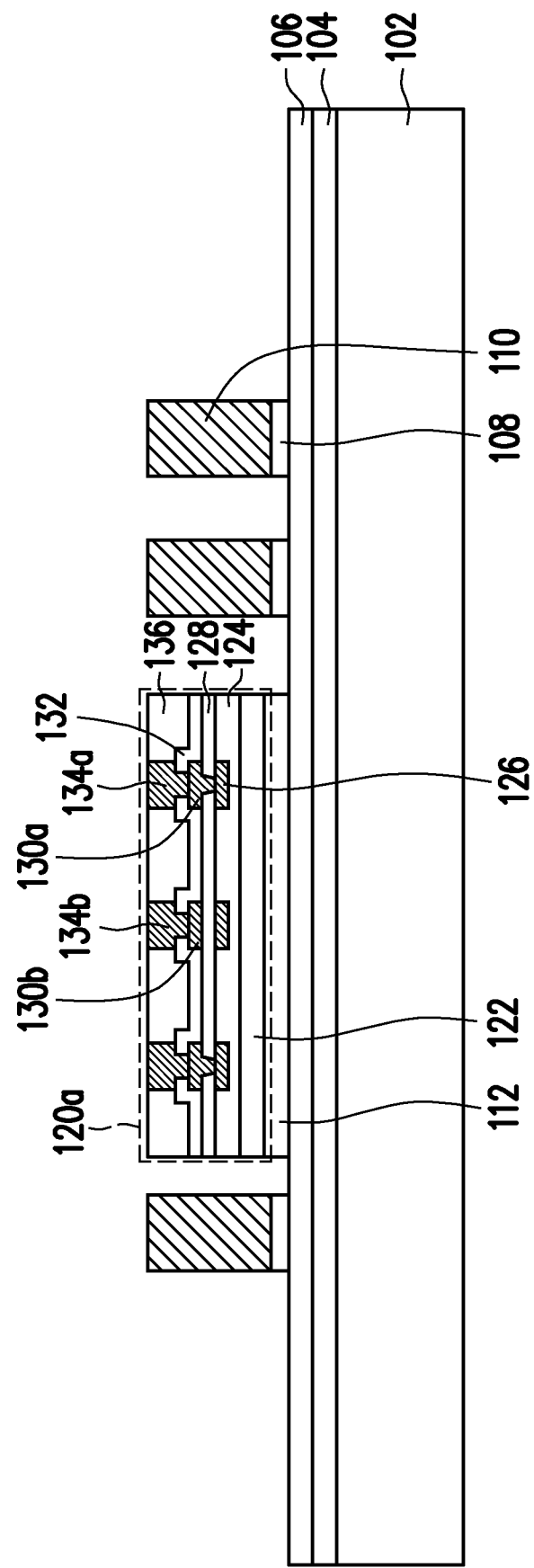

Referring to FIG. 16, after the conductive pillars 110 are formed, an integrated circuit (IC) die 120a is adhered to the dielectric layer 106 by an adhesive layer 112. The IC die 120b or 120c may be used instead of the IC die 120a in some examples. The IC die 120a, 120b or 120c, as shown in FIG. 9, FIG. 10 or FIG. 11, is attached laterally aside the conductive pillars 110. The IC die 120a may be a logic die (e.g., central processing unit, microcontroller, etc.), a memory die (e.g., dynamic random access memory (DRAM) die, a static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) die), the like, or a combination thereof.

In some embodiments, the back-side surface of the IC die 120a may be referred to as a non-active surface. The adhesive layer 112 may be applied to the back-side surfaces of the IC die 120a. The adhesive layer 112 may be any suitable glue, epoxy, die attach film (DAF), or the like.

Figure 17:
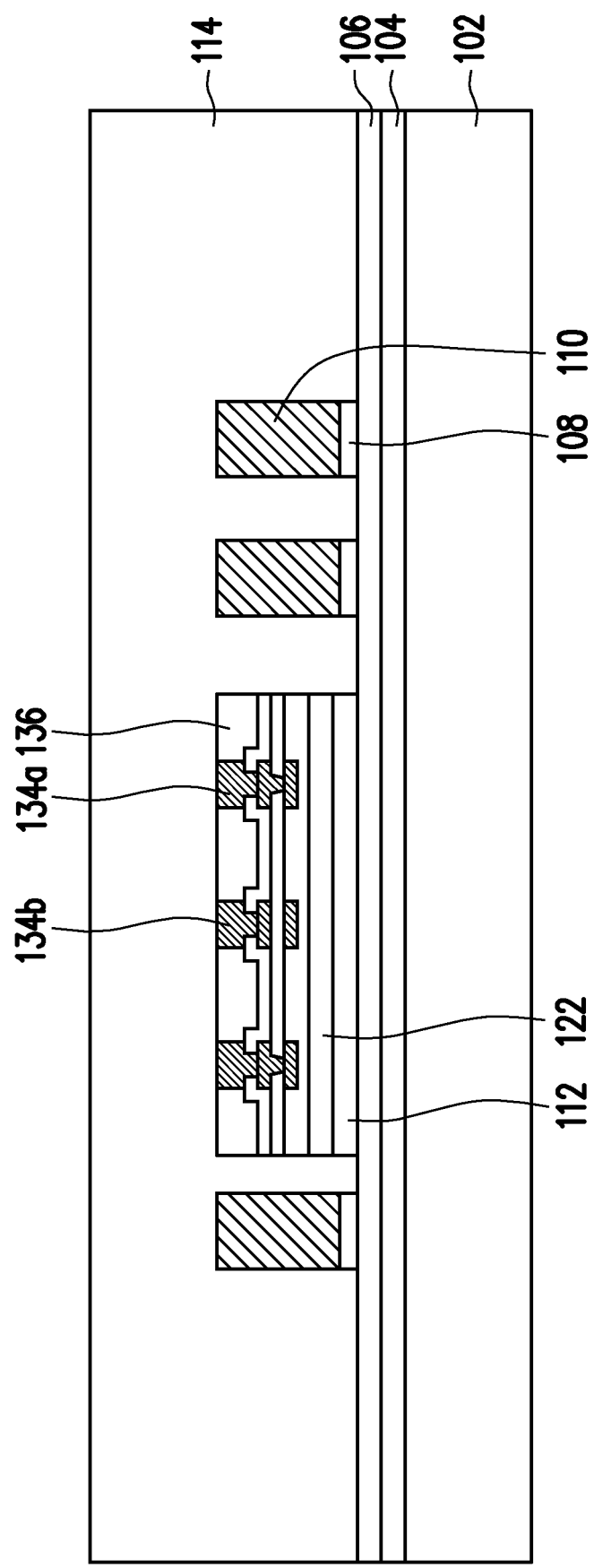
Figure 18:
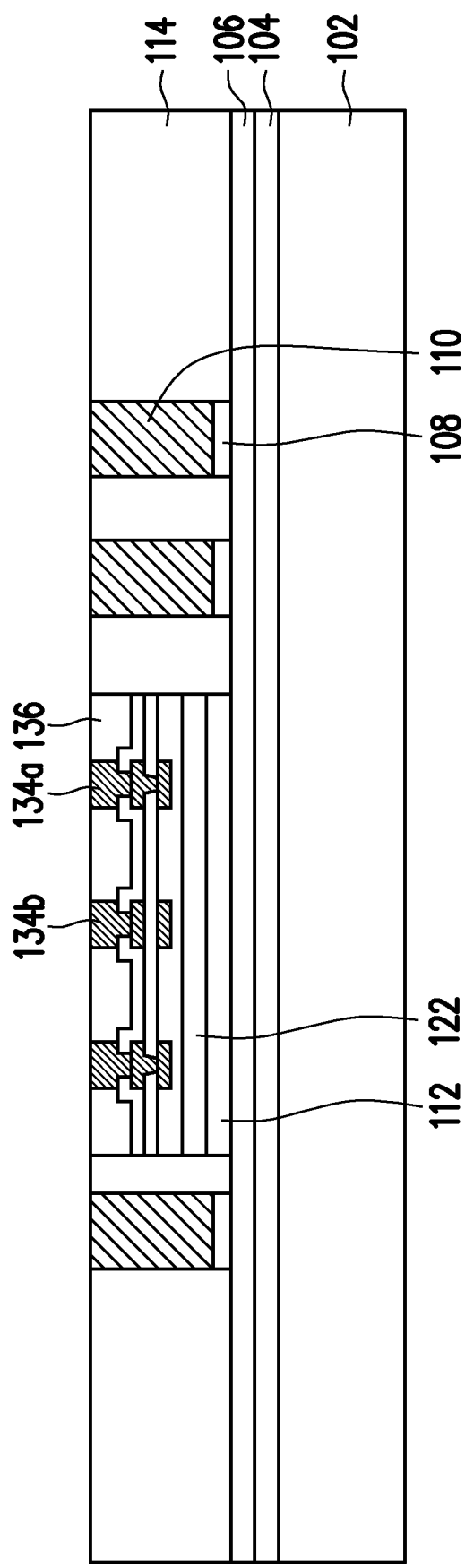

Referring to FIG. 17, an encapsulant 114 is formed on the various components. After formation, the encapsulant 114 laterally encapsulates IC die 120a and the conductive pillars 110 and is formed over the carrier substrate 102, such that the IC die 120a is buried and/or covered. The encapsulant 114 is then cured. In some embodiments, the encapsulant 114 includes a molding compound, a molding underfill, a resin such as epoxy, a combination thereof, or the like. In some other embodiments, the encapsulant 114 includes a photo-sensitive material such as polybenzoxazole (PBO), polyimide (PI), benzocyclobutene (BCB), a combination thereof, or the like, which may be easily patterned by exposure and development processes or laser drilling process. In alternative embodiments, the encapsulant 114 includes nitride such as silicon nitride, oxide such as silicon oxide, phosphosilicate glass (PSG), borosilicate glass (BSG), boron-doped phosphosilicate glass (BPSG), a combination thereof, or the like. The encapsulant 114 may be applied by compression molding, transfer molding, spin-coating, lamination, deposition, or similar processes Referring to FIG. 18, a planarization process is then performed on the encapsulant 114 to remove a portion of the encapsulant 114, such that the top surfaces of the conductive pillars 110 and the active connectors 134a and dummy connectors 134b are exposed. In some embodiments, top surfaces of the conductive pillars 110, the active connectors 134a, the dummy connectors 134b, the protection layer 136, and the encapsulant 114 are substantially coplanar after the planarization process. The planarization process may be, for example, a chemical-mechanical polishing process (CMP), a grinding process, or the like. In some embodiments, the planarization may be omitted, for example, if the conductive pillars 110, the active connectors 134a and the dummy connectors 134b are already exposed. The conductive pillars 110 penetrate the encapsulant 114, and the conductive pillars 110 are sometimes referred to as through vias or through integrated fan-out vias (TIVs).

During the planarization process to reveal the conductive pillars 110 and the top surfaces of the active connectors 134a and the dummy connectors 134b, if the dummy connectors 134b of the disclosure are not provided in the protection layer 136, the planarization process may crack the semiconductor substrate 122, which is similar to what is discussed in FIG. 8. With the disposition of the dummy connectors 134b, the semiconductor substrate 122 is prevented from cracking because the dummy connectors are provided against the polishing or grinding wheel. In such manner, the polishing or grinding wheel is subjected to less variation in the grinding rate during operation. Therefore, the polishing uniformity is accordingly improved, and thus the yield of the package is improved.

Figure 19:
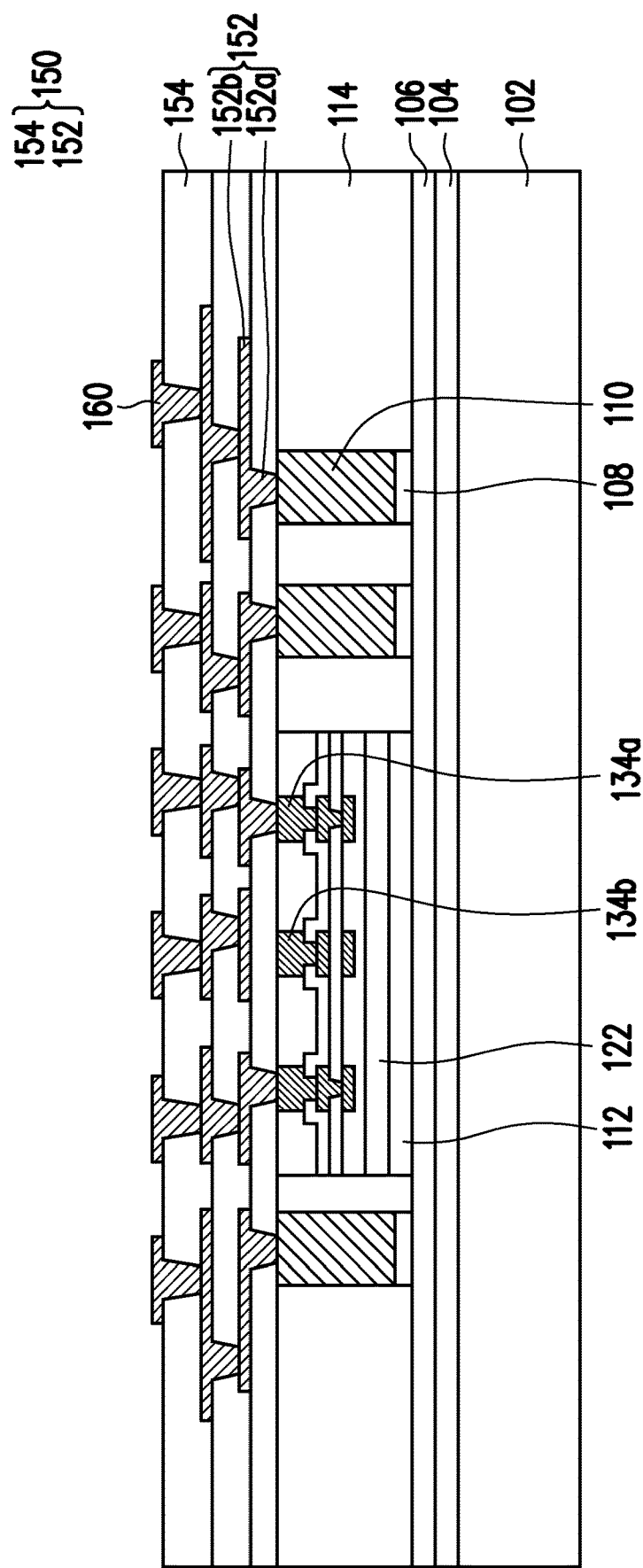

Referring to FIG. 19, a redistribution layer 150 is formed on the encapsulant 114. In certain embodiments, the redistribution layer 150 is formed over and covers the conductive pillars 110, the IC die 120a and the encapsulant 114. The redistribution layer 150 functions as an electrical connection structure. The redistribution layer 150 is electrically connected with the IC die 120a and the conductive pillars 110. In some embodiments, the redistribution layer 150 is electrically connected to the IC die 120a through the active connectors 134a. In some embodiments, as shown in FIG. 19. The redistribution layer 150 is electrically isolated from the dummy connectors 134b. In some embodiments, the redistribution layer is connected with the dummy connectors 134b. However, since the dummy connectors 134b are electrically isolated from the interconnection structure 124, the redistribution layer 150 does not electrically connects to the interconnection structure 124 through the dummy connectors 134b.

In some embodiments, the redistribution layer 150 includes one or more metallization layers 152 one or more polymer layers 154 arranged in alternation. In certain embodiments, one or more the metallization layers 152 may include metal vias 152a and metal routings 152b physically and electrically interconnected through the metal vias 152a. In some embodiments, the metallization layer 152 is sandwiched between the polymer layers 154, but the top surface of the metallization layer 152 is exposed by the topmost layer of the polymer layers 154 and the lowest layer of the metallization layers 152 is exposed by the lowest layer of the polymer layers 154 to connect the active connectors 134a and the conductive pillars 110. The number of the metallization layers 152 and the polymer layers 154 included in the redistribution layer 150 is determined according to the desired properties of the integrated circuit structure. In some embodiments, the material of the metallization layers 152 includes aluminum, titanium, copper, nickel, tungsten, and/or alloys thereof. The metallization layers 152 may be formed by electroplating or deposition. In some embodiments, the material of the polymer layers 154 includes polyimide, epoxy resin, acrylic resin, phenol resin, benzocyclobutene (BCB), polybenzoxazole (PBO), or any other suitable poly-based dielectric material. The dielectric layers may be formed by deposition.

The under-ball metallurgy (UBM) patterns 160 may be formed on the top surface of the topmost layer of the metallization layers 152 exposed by the topmost layer of the polymer layers 154 for electrically connecting with conductive connectors (such as conductive balls). In some embodiments, the materials of the UBM patterns 160 may include copper, nickel, titanium, tungsten, or alloys thereof or the like, and may be formed by an electroplating process, for example. The number of the UBM patterns 160 corresponds to the number of portions of the top surface of the topmost layer of the metallization layers 152 exposed by the topmost layer of the polymer layers 154.

Figure 20:
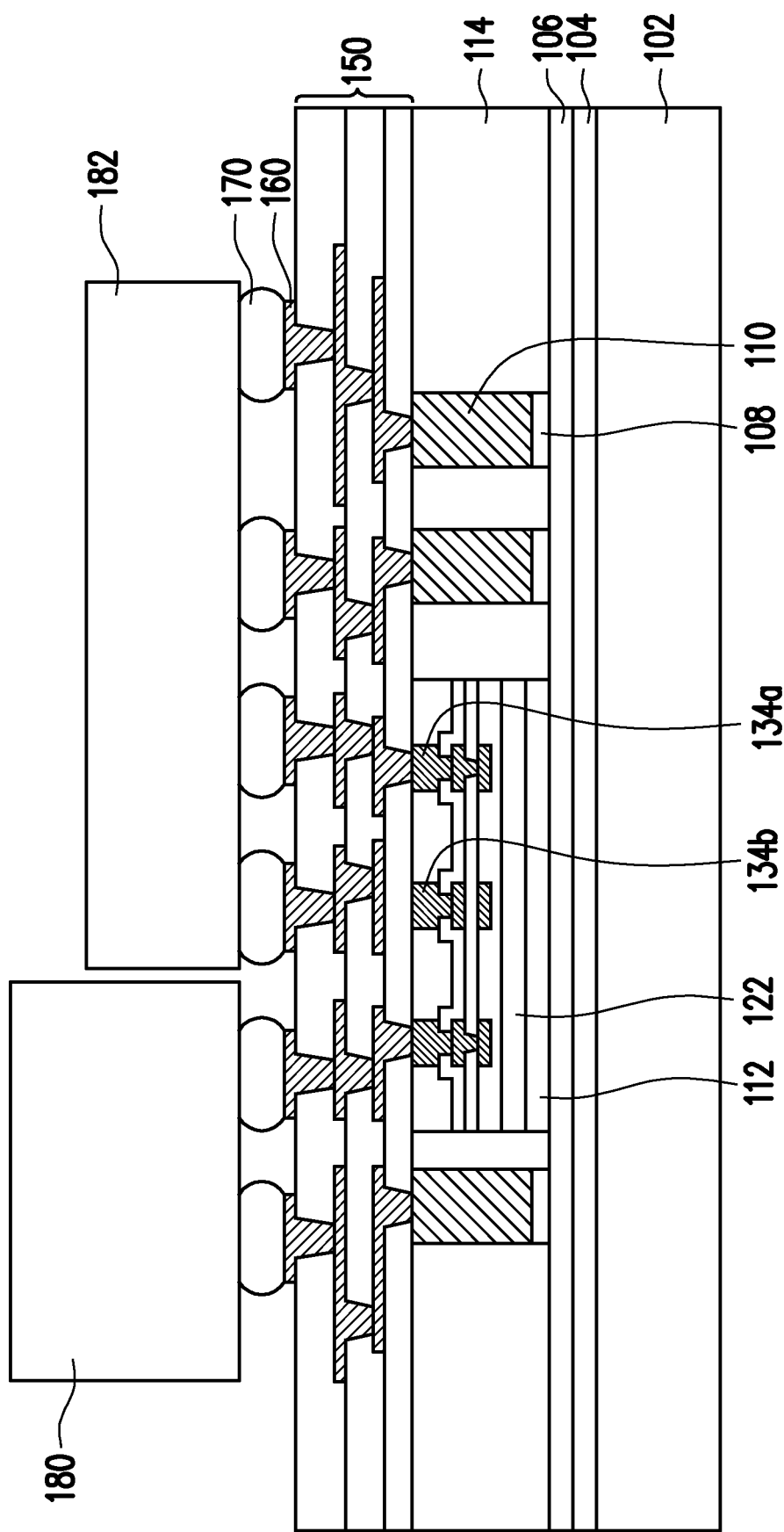

Referring to FIG. 20, a plurality of conductive connectors 170 is formed on UBM patterns 160, and are physically and electrically connected to the UBM patterns 160. In some embodiments, the conductive connectors 170 may be disposed on the UBM patterns 160 by a ball placement process and followed by a reflow process. In some embodiments, the conductive connectors 170 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. In some embodiments, the redistribution layer 150 is located between the insulating encapsulant 114 and the conductive connectors 170, between the IC die 120a and the conductive connectors 170, and between the conductive pillars 110 and the conductive connectors 170. In some embodiments, the conductive connectors 170 are electrically connected to the redistribution layer 150 through the UBM patterns 160. In some embodiments, some of the conductive connectors 170 are electrically connected to the IC die 120a through the UBM patterns 160, the redistribution layer 150 and the active connectors 134a. In some embodiments, the conductive connectors 170 are electrically connected to some of the conductive pillars 110 through the UBM patterns 160 and the redistribution layer 150.

The semiconductor dies 180 and 182 are bonded to the redistribution layer 150 through flip chip bonding. The semiconductor dies 180 and 182 are flipped so that the active sides of the semiconductor dies 180 and 182 are facing the redistribution layer 150. For example, the active sides of the semiconductor dies 180 and 182 are the front-sides of the semiconductor dies 180 and 182. Specifically, the IC die, or the semiconductor die 120a is bonded to the semiconductor dies 180 and 182 in a face-to-face configuration. Other configuration such as a back-to-face configuration or back-to-back configuration may be applied in other examples. The semiconductor dies 180 and 182 are electrically connected to the UBM patterns 160 through the conductive connectors 170. In some embodiments, the semiconductor die 180 may be a high bandwidth memory (HBM) or the like. In some embodiments, the semiconductor die 182 may be a silicon-on-chip (SOC) or the like. The number and the types of the semiconductor dies 180 and 182 are not limited thereto.

Figure 21:
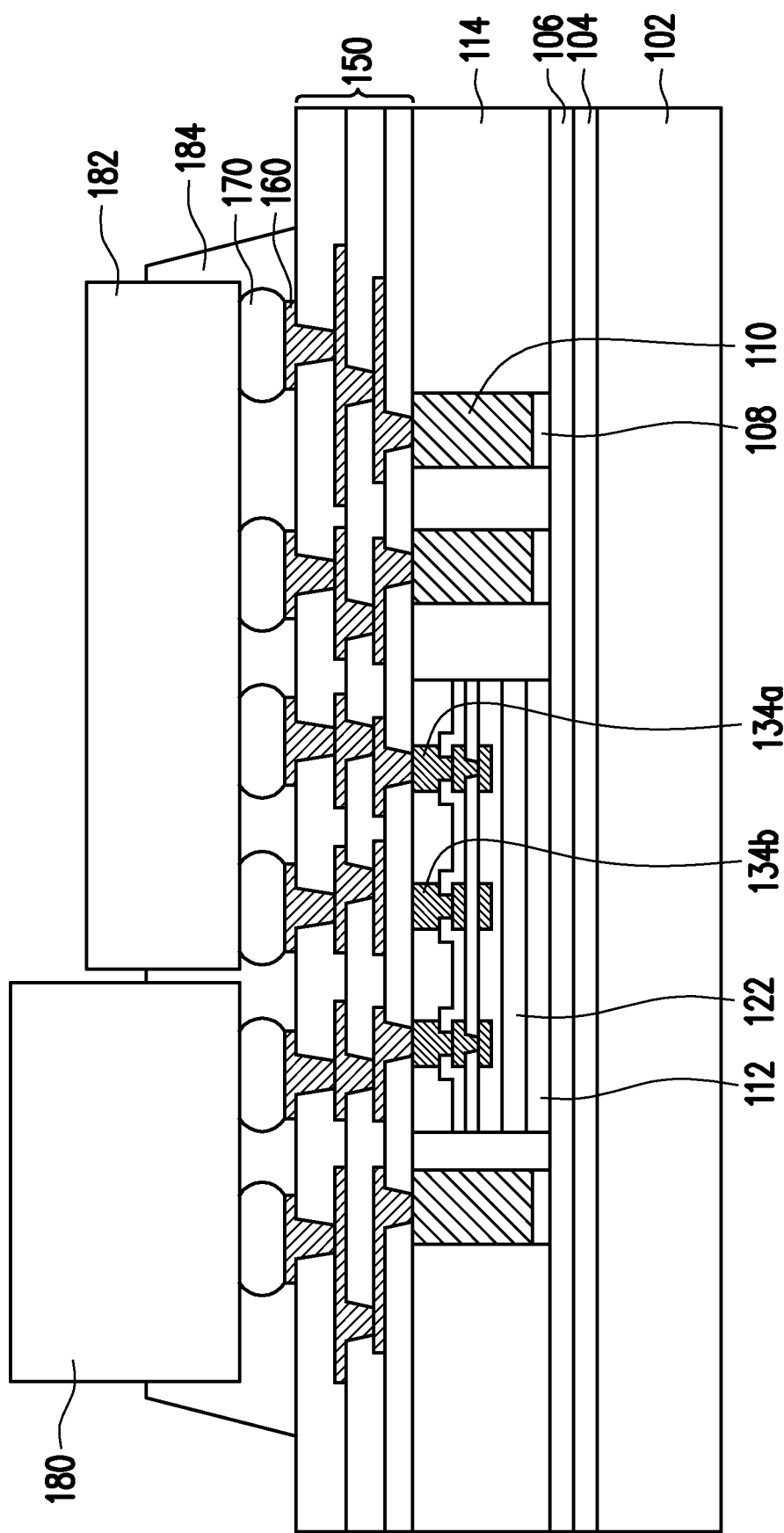

Referring to FIG. 21, an underfill layer 184 is formed between the redistribution layer 150 and the semiconductor dies 180 and 182 to fill the space between the semiconductor die 120a and each of the semiconductor dies 180 and 182. Specifically, the underfill layer 184 is formed around the conductive connectors 170 and the UBM patterns 160. The material of the underfill layer 184 may be any suitable material, such as a polymer, epoxy, molding underfill, or the like.

Figure 22:
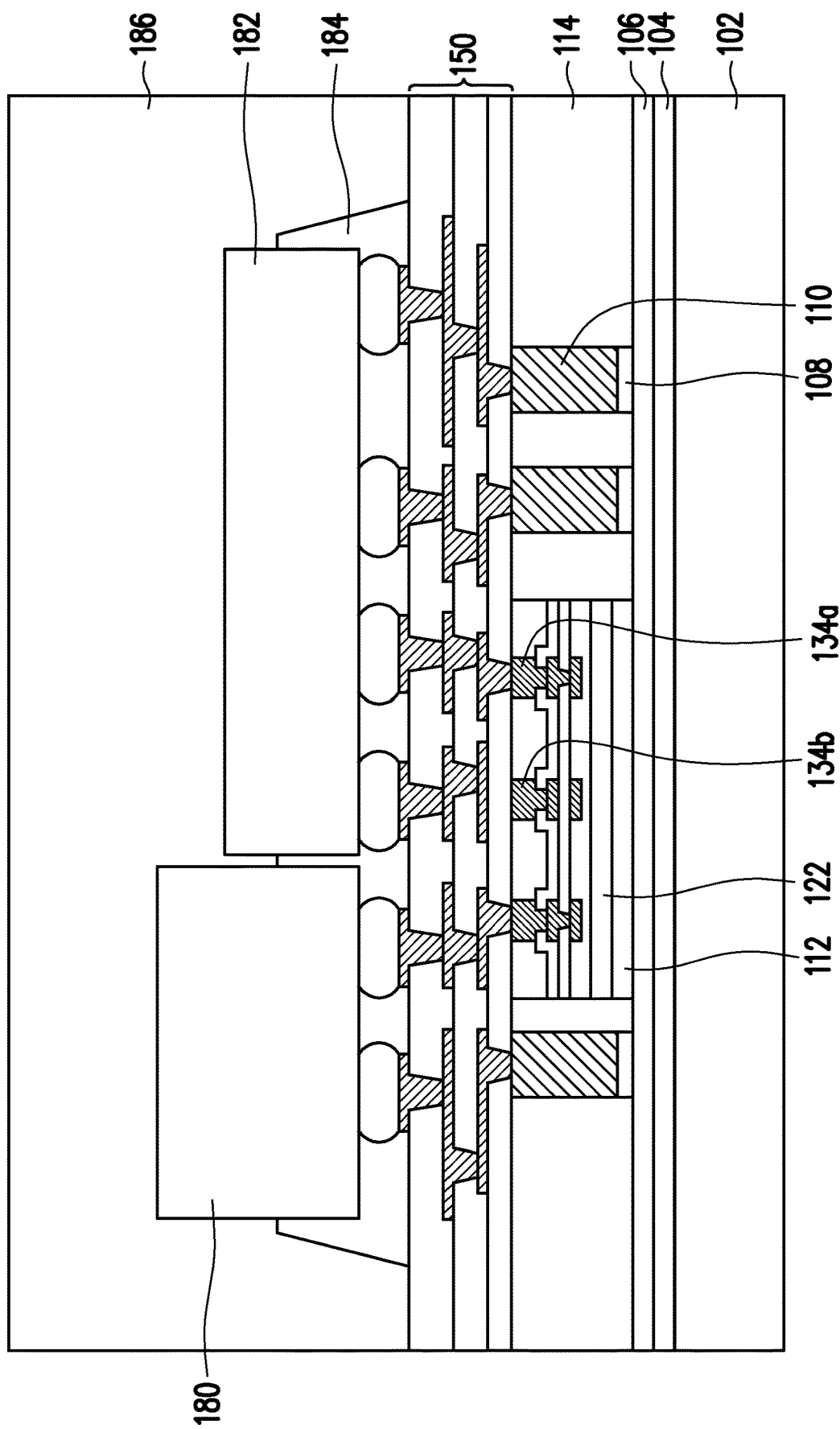

Referring to FIG. 22, an encapsulant 186 is formed to encapsulate the underlying components. After formation, the encapsulant 186 laterally encapsulates the semiconductor dies 180 and 182, the underfill layer 184 and the redistribution layer 150. The formation methods and materials of the encapsulant 186 are similar to the processes and materials for forming the encapsulant 114 as described in FIG. 17, and thus may not be repeated herein. In some embodiments, the material of the encapsulant 186 is the same as the material of the encapsulant 114. In some embodiments, the material of the encapsulant 186 is different from the material of the encapsulant 114.

Figure 23:
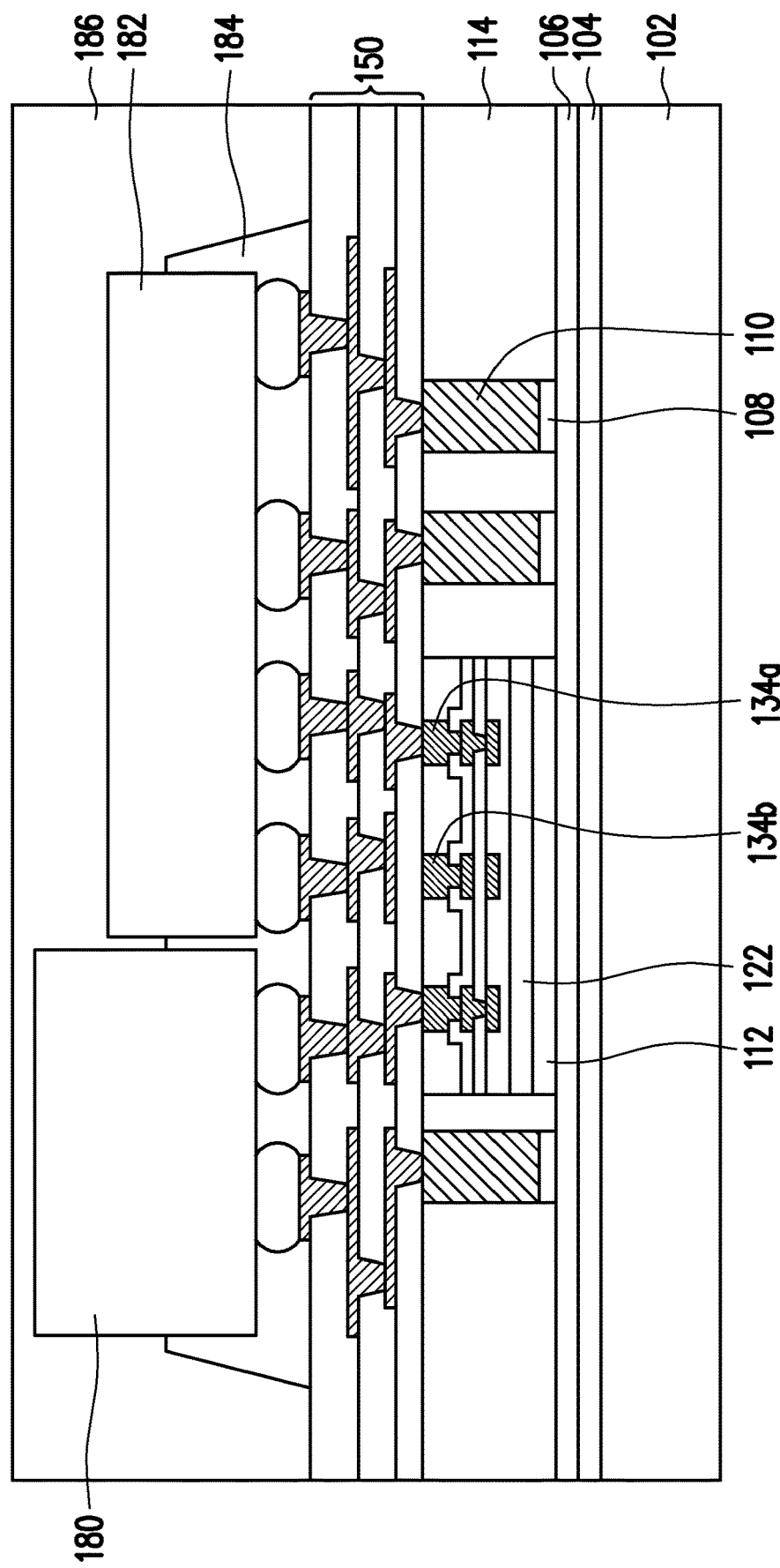

Referring to FIG. 23, a planarization process is then performed on the top surface of the encapsulant 186 to remove a portion of the encapsulant 186. After the planarization process, the semiconductor dies 180 and 182 are still enclosed by the encapsulant 186. The planarization process may be, for example, a chemical-mechanical polishing process (CMP), a grinding process, or the like.

Figure 24:
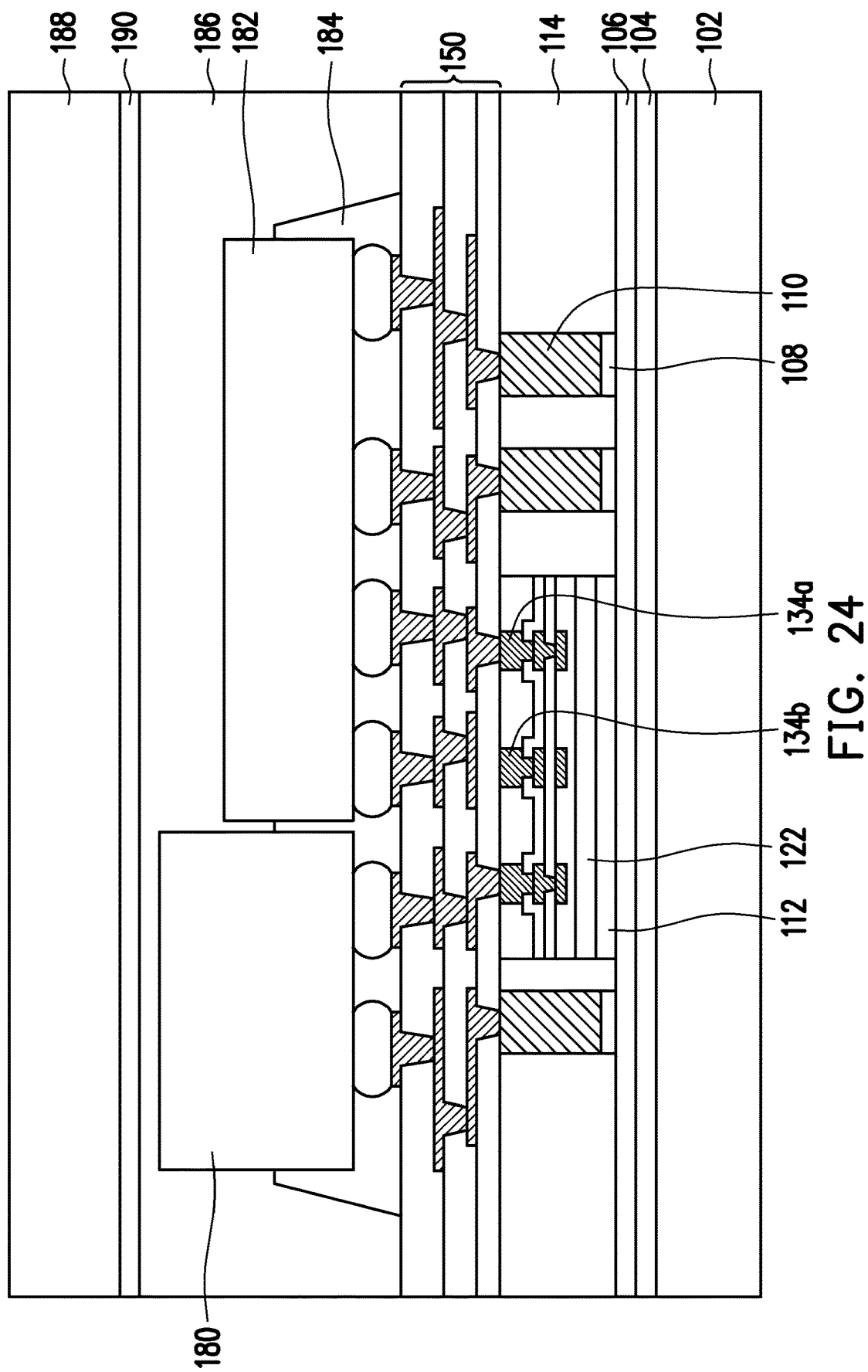

Referring to FIG. 24, a release layer 190 is formed on the encapsulant 186 and a substrate 188 is disposed on the release layer 190. The materials of the substrate 188 and the release layer 190 are similar to the materials of the carrier substrate 102 and release layer 104 as described in FIG. 13, and thus may not be repeated herein. In some embodiments, the material of the substrate 188 may be the same as or different from the material of the carrier substrate 102. In some embodiments, the material of the release layer 190 may be the same as or different from the material of the release layer 104.

Figure 25:
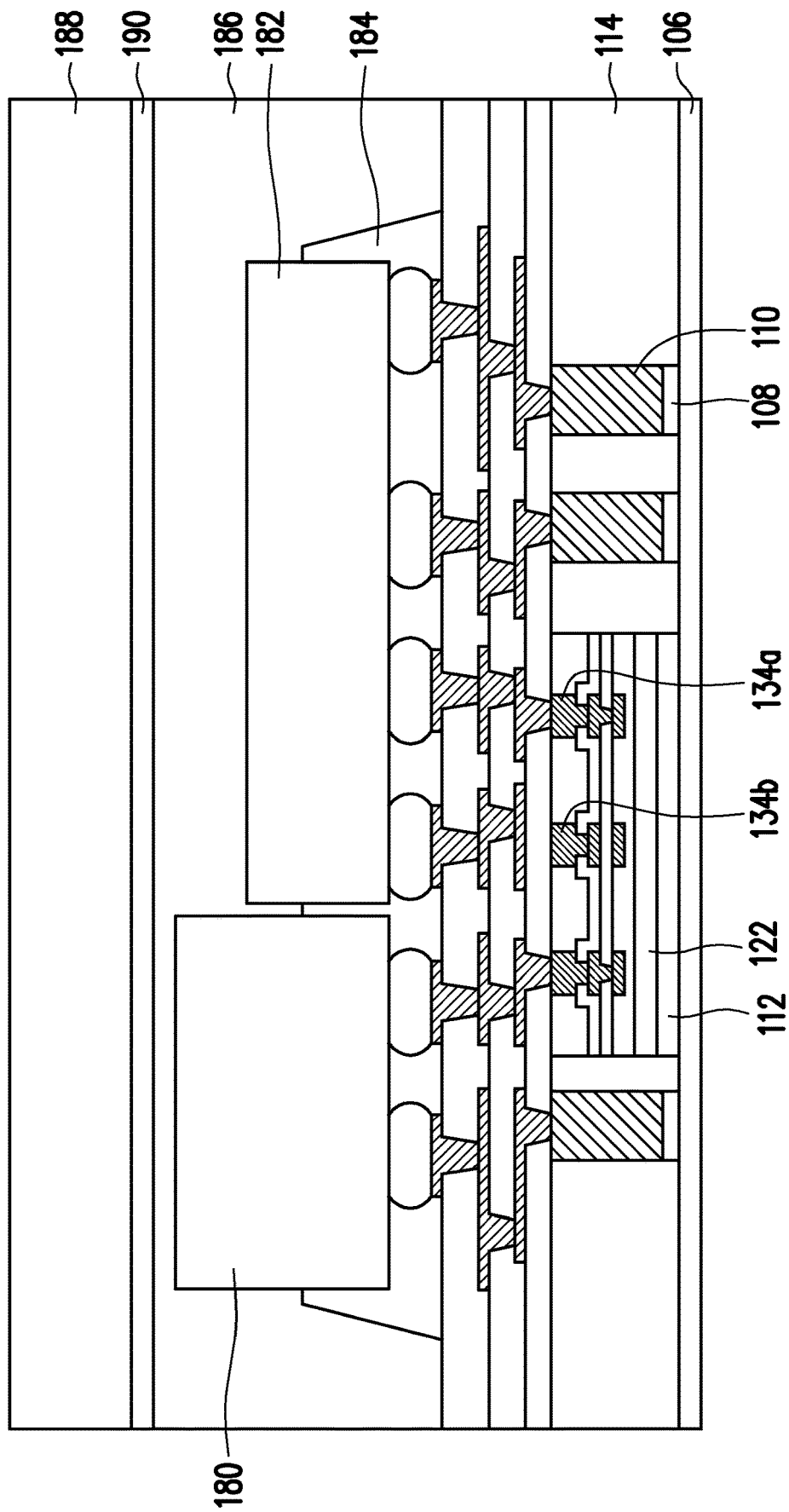

Referring to FIG. 25, a substrate de-bonding is performed to detach the carrier substrate 102 from the dielectric layer 106. In some embodiments, the de-bonding includes projecting a light such as a laser light or an UV light on the release layer 104 so that the release layer 104 decomposes under the heat of the light, and the carrier substrate 102 may be removed.

Figure 26:
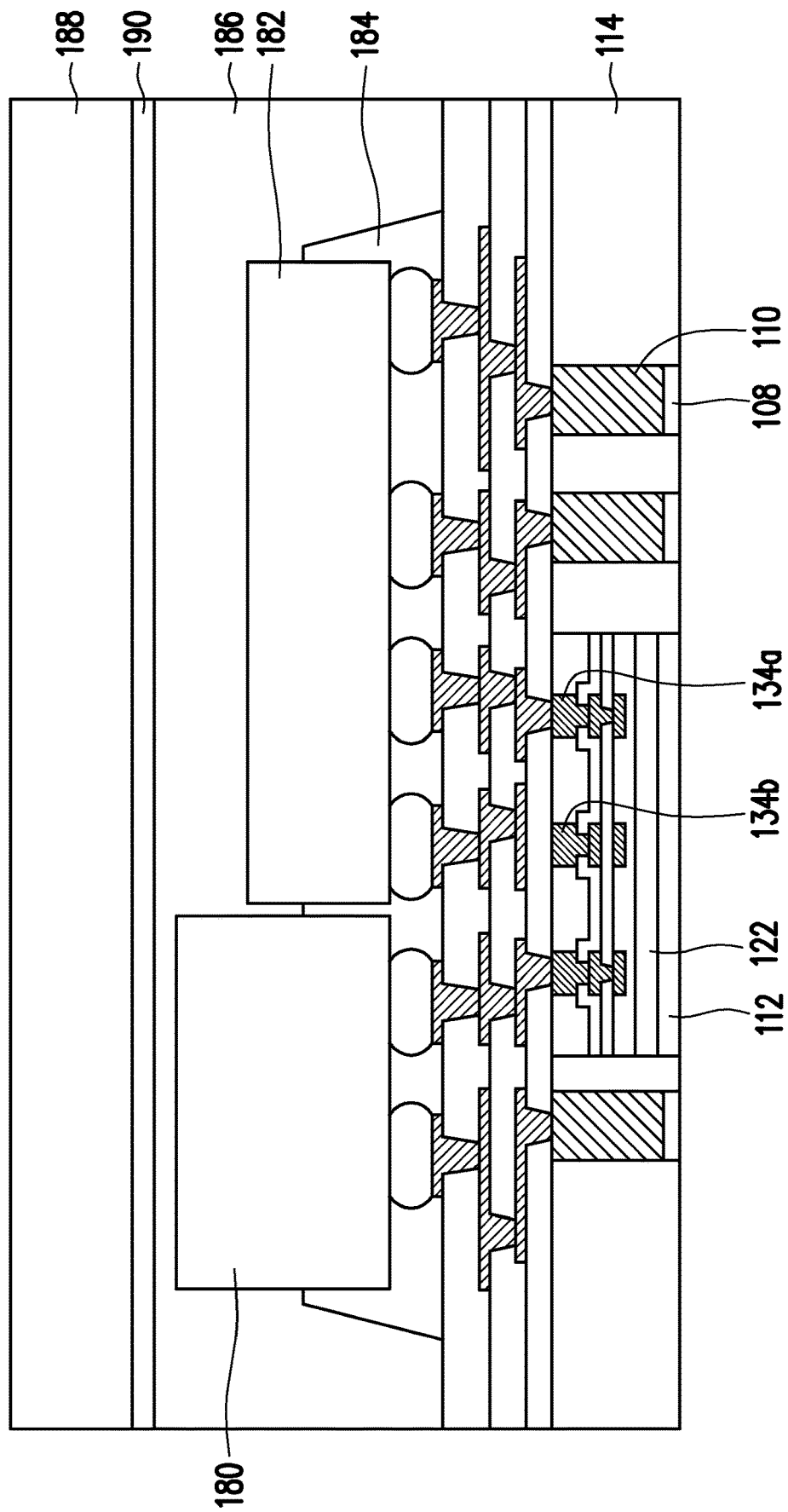

Referring to FIG. 26, the dielectric layer 106 is then removed by a suitable process. In some embodiments, the removing process may be an etching process, a polishing process, or the like.

Figure 27:
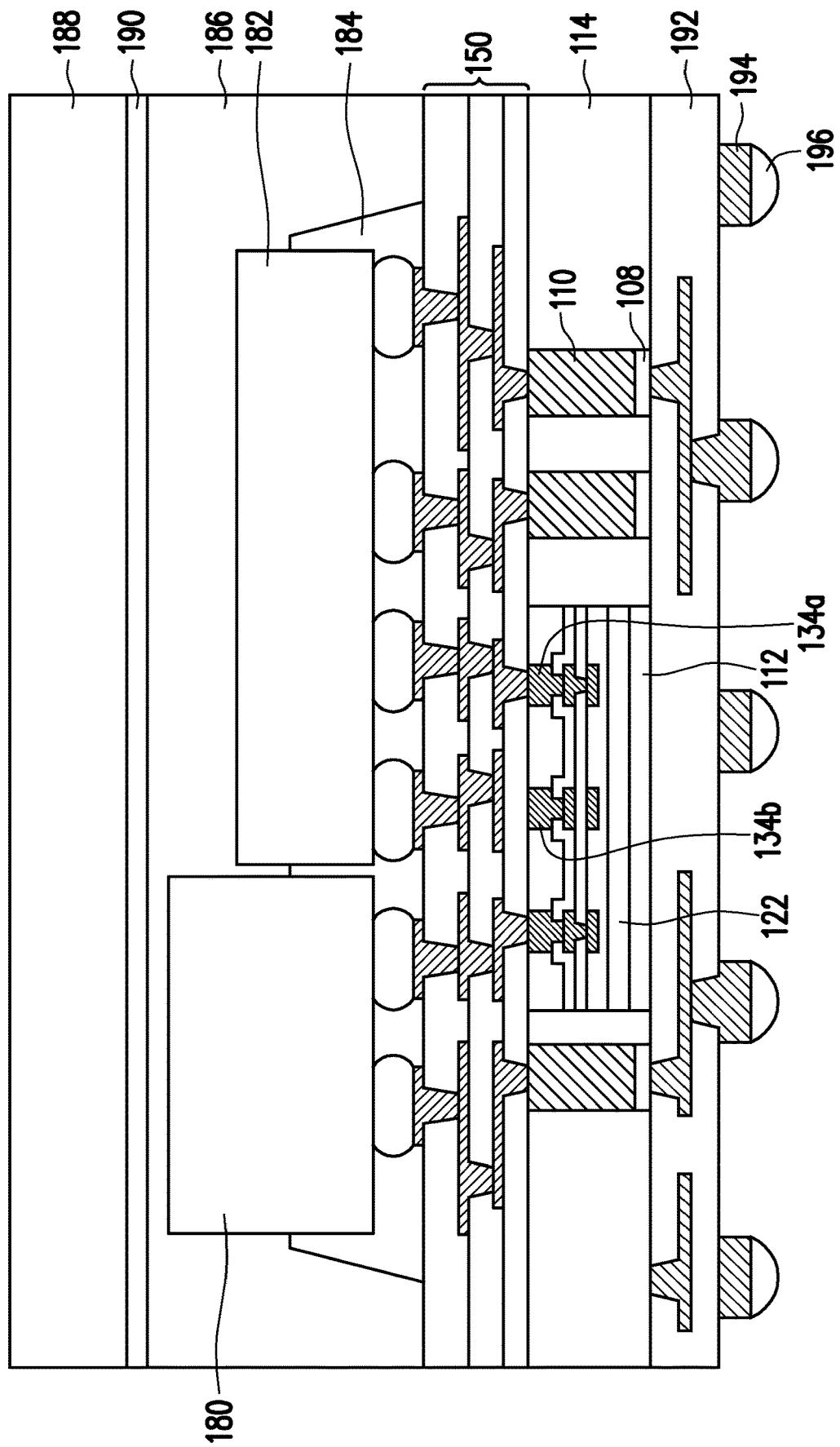

Referring to FIG. 27, a back-side redistribution layer 192 is formed on the bottom surfaces of the encapsulant 114, the seed layer 108, and the adhesive layer 112. The back-side redistribution layer 192 is electrically connected to the semiconductor dies 180 and 182 through the seed layer 108, the conductive pillars 110, the redistribution layer 150, the UBM patterns 160 and the conductive connectors 170. The back-side redistribution layer 192 is electrically connected to the IC die 120a through the seed layer 108, the conductive pillars 110, the redistribution layer 150 and the active connectors 134a. The back-side redistribution layer 192 may be formed in a manner similar to the redistribution layer 150, and may be formed of the same material as the redistribution layer 150. The back-side redistribution layer 192 is shown as an example. More or fewer dielectric layers and metallization patterns may be formed in back-side redistribution layer 192.

The back-side redistribution layer 192 further includes UBM patterns 194. As shown in FIG. 27, the UBM patterns 194 extend through the upmost polymer layer of the back-side redistribution layer 192 and are electrically connected to the metal features of the back-side redistribution layer 192. In another embodiment, the UBM patterns 194 are formed in openings of the polymer layers of the back-side redistribution layer 192. The UBM patterns 194 may be formed in manner similar to similar to the UBM patterns 160, and may be formed of the same or different material as the UBM patterns 160.

The conductive connectors 196 may be formed in manner similar to the conductive connectors 170, and may be formed of the same or different material as the conductive connectors 170. The conductive connectors 196 may be used to bond to an additional electrical component, which may be a semiconductor substrate, a package substrate, a printed circuit board (PCB), or the like.

Figure 28:
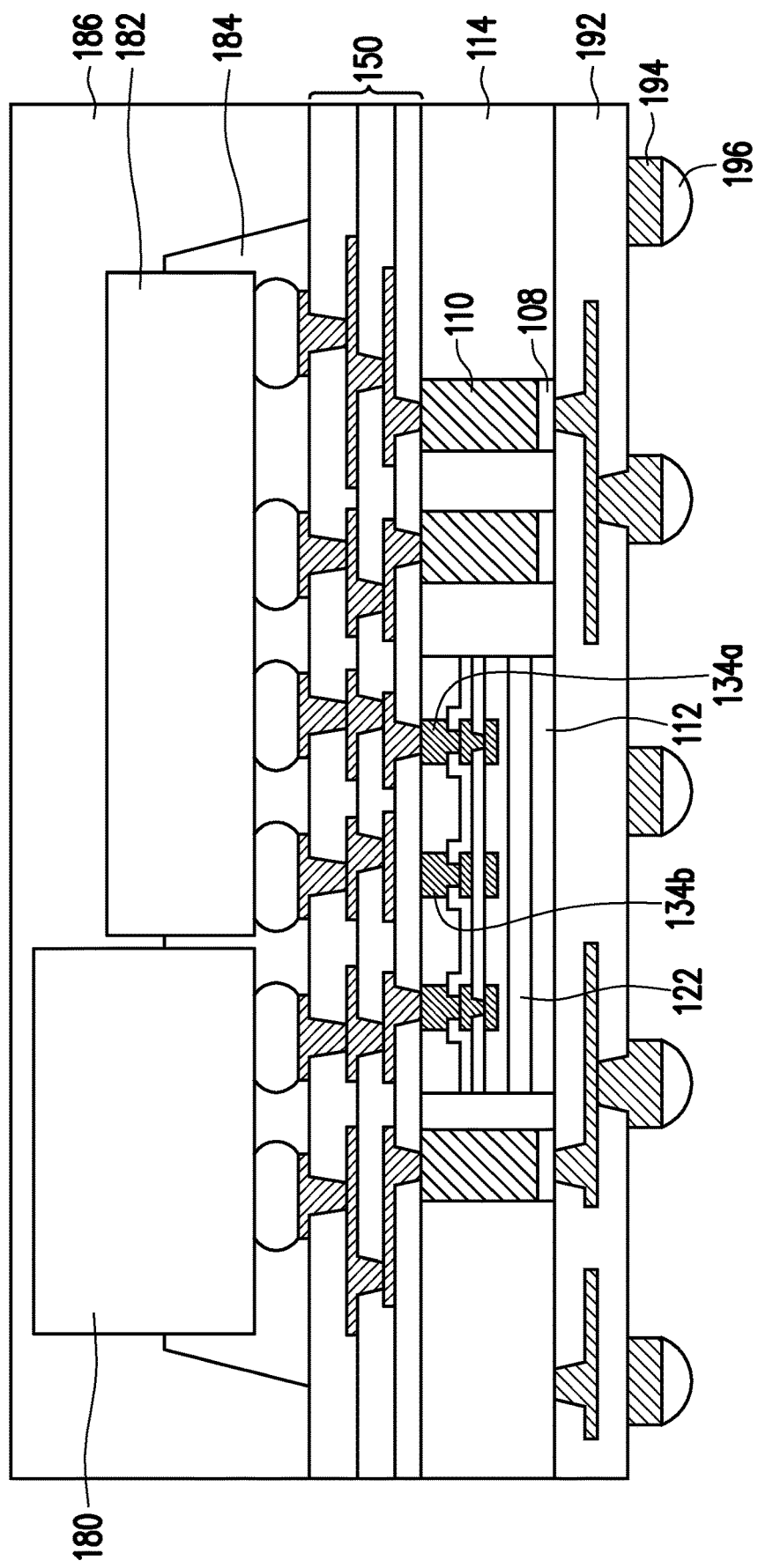

Referring to FIG. 28, a substrate de-bonding is performed to detach the substrate 188 from the encapsulant 186. In some embodiments, the de-bonding includes projecting a light such as a laser light or an UV light on the release layer 190 so that the release layer 190 decomposes under the heat of the light and the substrate 188 may be removed.

Figure 29:
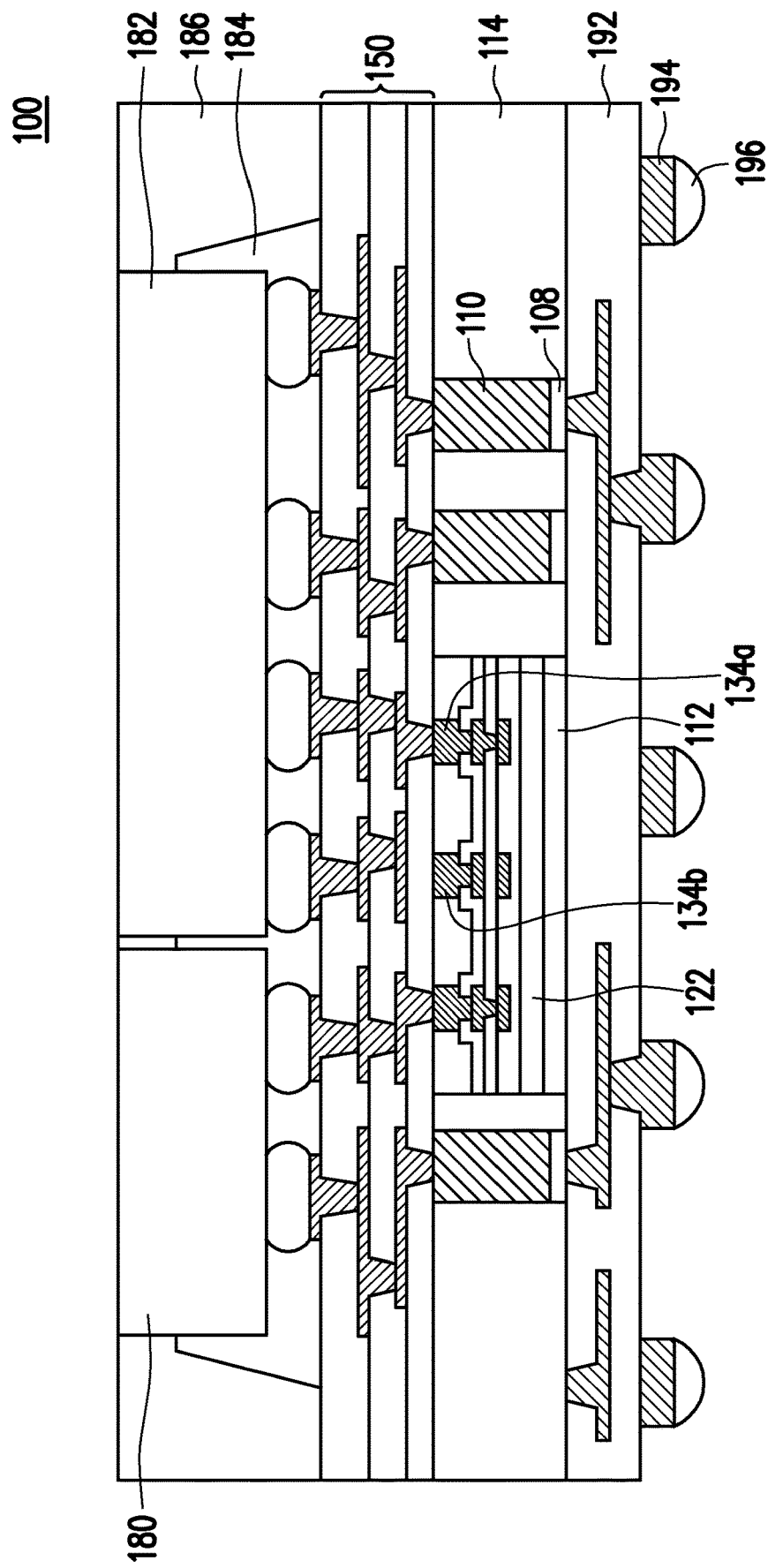

Referring to FIG. 29, a planarization process is then performed on the encapsulant 186 to remove a portion of the encapsulant 186 and portions of the semiconductor dies 180 and 182, such that the top surfaces of the encapsulant 186 and the semiconductor dies 180 and 182 are exposed. After the planarization process, an integrated circuit structure 100 is formed. In some embodiments, top surfaces of the semiconductor dies 180 and 182, and the encapsulant 186, are substantially coplanar after the planarization process. The planarization process may be, for example, a chemical-mechanical polishing process (CMP), a grinding process, or the like.

By forming the dummy connectors in the IC die which acts as a bridge die of the integrated circuit structure, the dummy connectors effectively prevent the IC die from cracking during the grinding process to reveal the top surfaces of the active connectors. This method can suppress the bridge die crack defect to almost 0% and have an almost 100% yield after TIV reveal.

According to some embodiments, an integrated circuit structure is disclosed. The integrated circuit structure includes a die that contains a substrate, an interconnection structure, active connectors and dummy connectors. The interconnection structure is disposed over the substrate. The active connectors and the dummy connectors are disposed over the interconnection structure. The active connectors are electrically connected to the interconnection structure, and the dummy connectors are electrically insulated from the interconnection structure.

According to some embodiments, an integrated circuit structure is disclosed. The integrated circuit structure includes a first die, a second die and a third die. The first die includes a device, an interconnection structure, active connectors and dummy connectors. The interconnection structure is disposed over the device. The active connectors and dummy connectors are disposed over the interconnection structure. The second die and a third die are disposed over and electrically connected to the first die. The second die and the third die are electrically connected to the device of the first die through the active connectors, respectively. The dummy connectors are electrically insulated from the device of the first die.

According to some embodiments, a method for forming an integrated circuit structure is disclosed. The method includes the following steps. A substrate is provided. An interconnection structure is formed over a substrate. Active pads and dummy pads are formed simultaneously over the interconnection structure. Active connectors and dummy connectors are formed simultaneously over the active pads and the dummy pads. A protection layer is formed over the active connectors and the dummy connectors. The active connectors are electrically connected to the interconnection structure, and the dummy connectors are electrically insulated from the interconnection structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure, comprising:
   a die, comprising:
      a substrate;
      an interconnection structure, disposed over the substrate;
      active connectors and dummy connectors, disposed over the interconnection structure;
      dummy pads, disposed between the dummy connectors and the interconnection structure; and
      a passivation layer, disposed between the dummy pads and the interconnection structure,
   wherein the active connectors are electrically connected to the interconnection structure and the dummy connectors are electrically insulated from the interconnection structure,
   wherein a cross-sectional shape of the active connectors is different from a cross-sectional shape of the dummy connectors.

2. The integrated circuit structure in claim 1, further comprising:
   active pads, disposed between and in contact with the active connectors and the interconnection structure.

3. The integrated circuit structure in claim 1, further comprising a protection layer aside the active connectors and the dummy connectors.

4. The integrated circuit structure in claim 1, wherein the passivation layer is in contact with the dummy pads and the interconnection structure.

5. The integrated circuit structure in claim 1, wherein a dimension of the dummy connectors is substantially the same as a dimension of the active connectors.

6. The integrated circuit structure in claim 1, wherein a dimension of the dummy connectors is different from a dimension of the active connectors.

7. The integrated circuit structure in claim 1, wherein the dummy connectors are provided with different dimensions.

8. The integrated circuit structure in claim 1, wherein a height difference between a first thickness of the substrate at a position corresponding to a dummy connector and a second thickness of the substrate at a position corresponding to an active connector adjacent to the dummy connector is equal to or less than 15 μm.

9. The integrated circuit structure in claim 1, wherein the dummy connectors are evenly distributed aside of the active connectors.

10. The integrated circuit structure in claim 1, wherein the active connectors and the dummy connectors together are evenly distributed across a die region.

11. The integrated circuit structure in claim 1, wherein top surfaces of the active connectors are flush with top surfaces of the dummy connectors.

12. An integrated circuit structure, comprising:
    a die, comprising:
       a device, disposed over a substrate;
       first metal features and second metal features, disposed laterally and electrically connected to the device;
       active connectors, disposed over and electrically connected to the first metal features through active pads; and
       dummy connectors, disposed aside the active connectors and electrically insulated from the second metal features,
    wherein from a top view, the active connectors have substantially the same size, while the dummy connectors have at least two different sizes, and wherein a height difference between a first thickness of the substrate at a position corresponding to a dummy connector and a second thickness of the substrate at a position corresponding to an active connector adjacent to the dummy connector is equal to or less than 15 μm.

13. The integrated circuit structure of claim 12, wherein the dummy connectors have three different sizes.

14. The integrated circuit structure of claim 12, further comprising:
dummy pads, disposed between the dummy connectors and the second metal features, respectively.

15. The integrated circuit structure of claim 14, wherein a cross-sectional shape of the active pads is different from a cross-sectional shape of the dummy pads.

16. The integrated circuit structure of claim 14, wherein a cross-sectional shape of the active pads is the same as a cross-sectional shape of the dummy pads.

17. The integrated circuit structure of claim 12, wherein the first metal features and the second metal features are embedded in a dielectric layer, and a sidewall of the dielectric layer is flush with a sidewall of the substrate.

18. A method of forming an integrated circuit structure, comprising:
providing a substrate;
forming a first metal feature and a second metal feature side by side and over the substrate, wherein the first metal feature is spatially separated from the substrate;
forming a first pad over the first metal feature;
forming a passivation layer over the first pad and the second metal feature;
forming an active connector penetrating through the passivation layer and electrically connected to the first pad; and
forming a dummy connector on the passivation layer and electrically insulated from the second metal feature,
wherein a height difference between a first thickness of the substrate at a position corresponding to the dummy connector and a second thickness of the substrate at a position corresponding to the active connector adjacent to the dummy connector is equal to or less than 15 μm.

19. The method of claim 18, further comprising forming a protection layer aside the active connector and the dummy connector.

20. The method of claim 18, further comprising forming a second pad over the second metal feature during the step of forming the first pad over the first metal feature, wherein the passivation layer is formed between the second pad and the dummy connector.

\* \* \* \* \*